United States Patent
Hasegawa

(10) Patent No.: US 6,862,159 B2
(45) Date of Patent: Mar. 1, 2005

(54) CPP MAGNETIC SENSING ELEMENT IN WHICH PINNED MAGNETIC LAYERS OF UPPER AND LOWER MULTILAYER FILMS ARE MAGNETIZED ANTIPARALLEL TO EACH OTHER, METHOD FOR MAKING THE SAME, AND MAGNETIC SENSING DEVICE INCLUDING THE SAME

(75) Inventor: Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/348,810

(22) Filed: Jan. 21, 2003

(65) Prior Publication Data

US 2003/0143431 A1 Jul. 31, 2003

(30) Foreign Application Priority Data

Jan. 25, 2002 (JP) ........................... 2002-016760

(51) Int. Cl.$^7$ ............................. G11B 5/127; G11B 5/39
(52) U.S. Cl. .................. 360/324.11; 428/611; 428/637; 428/668; 428/686; 428/213; 428/692
(58) Field of Search .................... 428/611, 637, 428/668, 686, 213, 692; 360/324.11, 313, 314, 315, 316, 324.1, 324.2, 131

(56) References Cited

U.S. PATENT DOCUMENTS

| | | | |
|---|---|---|---|
| 5,748,399 A | 5/1998 | Gill | |
| 6,124,711 A | 9/2000 | Tanaka et al. | |
| 2002/0030947 A1 | * 3/2002 | Chen et al. | 360/319 |
| 2002/0067581 A1 | * 6/2002 | Hiramoto et al. | 360/322 |
| 2002/0191348 A1 | * 12/2002 | Hasegawa et al. | 360/314 |
| 2003/0053270 A1 | * 3/2003 | Gill | 360/324.11 |
| 2003/0184919 A1 | * 10/2003 | Lin et al. | 360/314 |
| 2004/0136231 A1 | * 7/2004 | Huai et al. | 365/158 |

* cited by examiner

Primary Examiner—Kevin M. Bernatz
(74) Attorney, Agent, or Firm—Brinks Hofer Gilson & Lione

(57) ABSTRACT

A magnetic sensing element includes a lower multilayer film including a lower pinned magnetic layer, a lower nonmagnetic layer, a free magnetic layer, an upper nonmagnetic layer, and an upper pinned magnetic layer; and an upper multilayer film including a lower pinned magnetic layer, a lower nonmagnetic layer, a free magnetic layer, an upper nonmagnetic layer, and an upper pinned magnetic layer. Each pinned magnetic layer includes a first pinned magnetic sublayer, a second pinned magnetic sublayer, and an intermediate nonmagnetic sublayer. By setting the magnetization direction of the second pinned magnetic sublayers in the lower multilayer film antiparallel to the second pinned magnetic sublayers in the upper multilayer film, the magnetic sensing element can output a pulsed signal directly when moving over a magnetization transition region.

21 Claims, 14 Drawing Sheets

CPP MAGNETIC SENSING ELEMENT IN WHICH PINNED MAGNETIC LAYERS OF UPPER AND LOWER MULTILAYER FILMS ARE MAGNETIZED ANTIPARALLEL TO EACH OTHER, METHOD FOR MAKING THE SAME, AND MAGNETIC SENSING DEVICE INCLUDING THE SAME

BACKGROUND OF THE INVENTION

1. Field of the Invention

The present invention relates to current-perpendicular-to-plane (CPP) magnetic sensing elements. More particularly, the invention relates to a magnetic sensing element capable of outputting a pulsed signal when moving over a magnetization transition region, a method for making the same, and a magnetic sensing device including the magnetic sensing element.

2. Description of the Related Art

FIG. 13 is a schematic diagram showing a state in which signal magnetic fields recorded in a recording medium which is magnetized perpendicular to the plane are detected by a conventional magnetic sensing element.

A magnetic sensing element S shown in FIG. 13 is a so-called spin-valve magnetic sensing element which is one type of giant magnetoresistive (GMR) element using a giant magnetoresistance effect and which detects recorded magnetic fields from a magnetic recording medium, such as a hard disk.

The spin-valve magnetic sensing element S includes a multilayer film in which an antiferromagnetic layer 1, a pinned magnetic layer 2, a nonmagnetic layer 3, and a free magnetic layer 4 are deposited in that order from the bottom, and a direct current is applied in the track width direction (in the X direction) of the multilayer film.

Typically, the antiferromagnetic layer 1 is composed of a Pt—Mn alloy film, the pinned magnetic layer 2 and the free magnetic layer 4 are composed of Ni—Fe alloy films, and the nonmagnetic layer 3 is composed of a Cu film.

The magnetization of the pinned magnetic layer 2 is pinned in the Y direction (in the direction of the leakage magnetic field from the recording medium, i.e., in the height direction) by an exchange anisotropic magnetic field between the antiferromagnetic layer 1 and the pinned magnetic layer 2. The magnetization of the free magnetic layer 4 is rotated by the leakage magnetic field from the recording medium.

A recording medium Mi shown in FIG. 13 is a perpendicular magnetic recording medium. The recording medium Mi travels in the Z direction.

When the magnetic sensing element S is located above the region Ma of the recording medium Mi and the leakage magnetic field from the recording medium is applied in the Y direction, the magnetization direction of the free magnetic layer 4 is changed from the X direction to the Y direction, and the electrical resistance of the magnetic sensing element is decreased. When the leakage magnetic field from the recording medium is applied antiparallel to the Y direction above the region Mb, the magnetization direction of the free magnetic layer 4 is changed toward the direction antiparallel to the Y direction, and the electrical resistance of the magnetic sensing element is increased. The leakage magnetic field is detected by a voltage change based on the change in the electrical resistance.

FIG. 14 is a diagram showing output signal waveforms of the magnetic sensing element S when the recorded magnetic fields in the region Ma to the region Mb are detected.

A leakage magnetic field in the Y direction always lies above the region Ma of the perpendicular recording medium Mi and a leakage magnetic field in the direction antiparallel to the Y direction always lies above the region Mb. Therefore, as shown in FIG. 14, the output from the spin-valve magnetic sensing element S is the integral output in which the state changes from low voltage to high voltage with the magnetization transition region Mt being the boundary. In the present signal processing technique for processing the output from the magnetic sensing element, since it is not possible to directly process the change in the integral output shown in the upper part of FIG. 14, the integral output is converted into a pulsed waveform shown in the lower part of FIG. 14 by a so-called differentiation circuit, and signal processing is then performed. However, if the output from the magnetic sensing element is passed through the differentiation circuit, noise tends to be superposed on the output signal, and the S/N ratio is deteriorated, resulting in a decrease in the net output.

SUMMARY OF THE INVENTION

It is an object of the present invention to provide a magnetic sensing element capable of directly outputting a higher-level pulsed signal when detecting a magnetic signal recorded in a perpendicular magnetic recording medium, a method for making the magnetic sensing element, and a magnetic sensing device including the magnetic sensing element.

In one aspect of the present invention, a magnetic sensing element includes lower and upper multilayer films, each multilayer film including a lower pinned magnetic layer, a lower nonmagnetic layer, a free magnetic layer, an upper nonmagnetic layer, and an upper pinned magnetic layer deposited in that order from the bottom; a lower antiferromagnetic layer disposed on the bottom of the lower multilayer film; an intermediate antiferromagnetic layer disposed between the lower and upper multilayer films; and an upper antiferromagnetic layer disposed on the top of the upper multilayer film. The magnetization of each pinned magnetic layer is pinned in a predetermined direction by an exchange coupling magnetic field produced between the pinned magnetic layer and the adjacent antiferromagnetic layer. A current flows perpendicular to the plane of each layer. The magnetization direction of the upper and lower pinned magnetic layers facing the free magnetic layer in the lower multilayer film and the magnetization direction of the upper and lower pinned magnetic layers facing the free magnetic layer in the upper multilayer film are antiparallel to each other.

That is, the magnetic sensing element of the present invention has a structure in which two so-called dual spin-valve magnetic sensing elements are stacked, and is a current-perpendicular-to-plane (CPP) magnetic sensing element in which a current flows perpendicular to the plane of each layer.

Furthermore, the magnetization direction of the upper and lower pinned magnetic layers facing the free magnetic layer in the lower multilayer film and the magnetization direction of the upper and lower pinned magnetic layers facing the free magnetic layer in the upper multilayer film are antiparallel to each other.

Due to the construction described above, the magnetic sensing element of the present invention can output a pulsed signal when moving over a magnetization transition region of a perpendicular recording medium which is magnetized perpendicular to the plane.

When the magnetic sensing element of the present invention is located above a region other than the magnetization transition region of the recording medium and a leakage magnetic field is applied to the two multilayer films in the same direction, the magnetization directions of two free magnetic layers are changed in the same direction. At this stage, the magnetization direction of one free magnetic layer changes so as to be parallel to the magnetization direction of the pinned magnetic layers which are opposed to the free magnetic layer with the nonmagnetic layers therebetween, and the magnetization direction of the other free magnetic layer changes so as to be antiparallel to the magnetization direction of the pinned magnetic layers which are opposed to the free magnetic layer with the nonmagnetic layers therebetween.

Consequently, resistance is decreased in one multilayer film and the resistance is increased in the other multilayer film. Moreover, since both multilayer films are connected in series, the changes in voltage in the individual multilayer films cancel each other out, and thereby the output from the magnetic sensing element is at the zero level (on the baseline).

When the relative position between the magnetic sensing element and the recording medium changes and the magnetic sensing element is located above the magnetization transition region, leakage magnetic fields are applied in different directions to the two multilayer films. At this stage, the magnetizations of the two free magnetic layers are oriented in different directions, resistance is either increased or decreased in both multilayer films. Moreover, since both multilayer films are connected in series, the voltage output from the magnetic sensing element is either at the positive level or at the negative level relative to the baseline.

When the relative position between the magnetic sensing element and the recording medium further changes and the leakage magnetic field is applied to the two multilayer films in the same direction, the output from the magnetic sensing element is at the zero level again.

Consequently, when the magnetic sensing element of the present invention moves over the magnetization transition region, it is possible to directly output a pulsed signal at the positive or negative level from the magnetic sensing element. Therefore, unlike the conventional case, signal processing can be performed without passing the output from the magnetic sensing element through a differentiation circuit, and superposition of noise can be suppressed, resulting in an increase in the S/N ratio of the magnetic sensing element.

Moreover, since the magnetic sensing element of the present invention has the structure in which two dual spin-valve magnetic sensing elements are stacked, output can be improved.

Additionally, in order to form the magnetic sensing element in which the magnetization direction of the upper and lower pinned magnetic layers facing the free magnetic layer in the lower multilayer film and the magnetization direction of the upper and lower pinned magnetic layers facing the free magnetic layer in the upper multilayer film are antiparallel to each other, the thicknesses of the pinned magnetic layers must be controlled and conditions for annealing in a magnetic field must be controlled, as will be described below.

In the present invention, preferably, all of the four pinned magnetic layers have the, same thickness.

In the present invention, preferably, each of the four pinned magnetic layers includes a first pinned magnetic sublayer, a second pinned magnetic sublayer, and an intermediate nonmagnetic sublayer interposed between the first pinned magnetic sublayer and the second pinned magnetic sublayer, the first and second pinned magnetic sublayers having different magnetic moments per unit area, the magnetic moment being the product of the saturation magnetization (Ms) and the film thickness (t). That is, preferably, each of the four pinned magnetic layers is a so-called synthetic-ferrimagnetic-type pinned magnetic layer. In the synthetic-ferrimagnetic-type pinned magnetic layer, since the first pinned magnetic sublayer and the second pinned magnetic sublayer pin each other's magnetization directions, the magnetization direction of the entire pinned magnetic layer can be strongly pinned in a predetermined direction.

In order to cause a difference in the magnetic moment (Ms×t) per unit area between the first pinned magnetic sublayer and the second pinned magnetic sublayer, for example, preferably, the first pinned magnetic sublayer and the second pinned magnetic sublayer are composed of the same magnetic material and the first pinned magnetic sublayer and the second pinned magnetic sublayer are formed so as to have different thicknesses.

In the present invention, by using a fabrication method which will be described below, even though all the pinned magnetic layers have a synthetic ferrimagnetic structure, it is possible to produce a magnetic sensing element in which the magnetization direction of the upper and lower pinned magnetic layers (second pinned magnetic sublayers) facing the free magnetic layer in the lower multilayer film and the magnetization direction of the upper and lower pinned magnetic layers (second pinned magnetic sublayers) facing the free magnetic layer in the upper multilayer film are antiparallel to each other.

When all of the pinned magnetic sublayers are formed as synthetic-ferrimagnetic-type pinned magnetic layers, preferably, in each pinned magnetic layer, the first pinned magnetic sublayer is in contact with one of the antiferromagnetic layers, and the second pinned magnetic sublayer faces one of the free magnetic layers. Also, preferably, the first pinned magnetic sublayers constituting the individual pinned magnetic layers have the same thickness, and the second pinned magnetic sublayers constituting the individual pinned magnetic layers have the same thickness.

Preferably, the two free magnetic layers constituting the two multilayer films have the same thickness and the four magnetic material layers constituting the two multilayer films have the same thickness.

Preferably, in the magnetic sensing element of the present invention, another intermediate antiferromagnetic layer is disposed on the intermediate antiferromagnetic layer with a hard magnetic layer therebetween.

In the present invention, the hard magnetic layer sandwiched between the two antiferromagnetic layers functions as a so-called in-stack bias layer. Magnetostatic coupling occurs between the ends of the hard magnetic layer and the ends of the free magnetic layers, and thereby the magnetization directions of the free magnetic layers are aligned in one direction.

If the hard magnetic layer is formed as the in-stack bias layer between the two multilayer films, it is possible to provide longitudinal bias magnetic fields of uniform magnitude to the two free magnetic layers formed in the two multilayer films.

In the present invention, preferably, all of the three or four antiferromagnetic layers have the same thickness.

If the two multilayer films include the pinned magnetic layers, the free magnetic layers, the nonmagnetic layers, and the antiferromagnetic layers, each having the same thickness, the two multilayer films have the same electrical resistance and the same rate of change in magnetoresistance. When a leakage magnetic field is applied in the same direction to the two multilayer films, the changes in voltage cancel each other out accurately. Therefore, when a pulsed signal is not output and a constant voltage is output, the voltage output in the case of upward magnetic field from the medium can be accurately matched to the voltage output in the case of downward magnetic field from the medium. Thereby, the constant baseline (zero level) can be easily maintained.

In particular, if the two antiferromagnetic layers sandwiching the hard magnetic layer which functions as the in-stack bias layer have the same thickness, since the distance between the free magnetic layer and the hard magnetic layer in one multilayer is equal to the distance between the free magnetic layer and the hard magnetic layer in the other multilayer, longitudinal bias magnetic fields with the same magnitude are applied to the individual free magnetic layers, thus being advantageous.

In the present invention, preferably, all of the three or four antiferromagnetic layers are composed of the same antiferromagnetic material.

In the present invention, preferably, each antiferromagnetic layer is composed of a PtMn alloy; an X—Mn alloy, where X is at least one element selected from the group consisting of Pd, Ir, Rh, Ru, Os, Ni, and Fe; or a Pt—Mn—X' alloy, where X' is at least one element selected from the group consisting of Pd, Ir, Rh, Ru, Au, Ag, Os, Cr, Ni, Ar, Ne, Xe, and Kr.

In another aspect of the present invention, a magnetic sensing device includes the magnetic sensing element described above, and signal magnetic fields recorded in a planar recording medium which is magnetized perpendicular to the plane are detected by the magnetic sensing element.

In the magnetic sensing device, as described above, when leakage magnetic field signals are read from the perpendicular magnetic recording medium in which the magnetization is pinned perpendicular to the plane, pulsed signals can be directly output from the magnetic sensing element.

In another aspect of the present invention, a method for making a magnetic sensing element includes the steps of:

(a) continuously forming a lower antiferromagnetic layer; a lower multilayer film including a lower pinned magnetic layer, a lower nonmagnetic layer, a free magnetic layer, an upper nonmagnetic layer, and an upper pinned magnetic layer; an intermediate antiferromagnetic layer; an upper multilayer film including a lower pinned magnetic layer, a lower nonmagnetic layer, a free magnetic layer, an upper nonmagnetic layer, and an upper pinned magnetic layer; and an upper antiferromagnetic layer in that order from the bottom, wherein each of the pinned magnetic layer is formed by depositing a first pinned magnetic sublayer and a second pinned magnetic sublayer having different magnetic moments per unit area with an intermediate nonmagnetic sublayer therebetween, the magnetic moment being the product of the saturation magnetization and the film thickness (Ms×t), the magnetic moment per unit area of the second pinned magnetic sublayer is larger than the magnetic moment per unit area of the first pinned magnetic sublayer in the lower multilayer film, and the magnetic moment of the first pinned magnetic sublayer is larger than the magnetic moment per unit area of the second pinned magnetic sublayer in the upper multilayer film; and (b) annealing a laminate including the lower antiferromagnetic layer, the lower multilayer film, the intermediate antiferromagnetic layer, the upper multilayer film, and the upper antiferromagnetic layer in a magnetic field that is larger than the coercive force and smaller than the spin-flop magnetic field of the pinned magnetic layer to produce an exchange coupling magnetic field between the first pinned magnetic sublayer and the antiferromagnetic layer so that the magnetization direction of the second pinned magnetic sublayers facing the free magnetic layer in the lower multilayer film is antiparallel to the magnetization direction of the second pinned magnetic sublayers facing the free magnetic layer in the upper multilayer film.

In the method for making the magnetic sensing element of the present invention, in step (a), the magnetic moments per unit area of the first pinned magnetic sublayer and the second pinned magnetic sublayer are set, and in step (b), the magnitude of the magnetic field in which annealing is performed is set. Thereby, by performing only one annealing step in a magnetic field, it is possible to set the magnetization direction of the second pinned magnetic sublayers facing the free magnetic layer in the lower multilayer film antiparallel to the magnetization direction of the second pinned magnetic sublayers facing the free magnetic layer in the upper multilayer film.

Consequently, the magnetic sensing element fabricated by the method of the present invention can directly output a pulsed signal when moving over a magnetization transition region of a recording medium. In particular, when a leakage magnetic field signal from a perpendicular recording medium which is magnetized perpendicular to the plane is read, a pulsed signal can be directly output.

In the present invention, since the layers from the lower multilayer film to the upper multilayer film can be continuously formed in a vacuum, it is possible to prevent impurities in air from being mixed into the magnetic sensing element.

Alternatively, a method for making a magnetic sensing element of the present invention includes, instead of step (a), a step of:

(c) continuously forming a lower antiferromagnetic layer; a lower multilayer film including a lower pinned magnetic layer, a lower nonmagnetic layer, a free magnetic layer, an upper nonmagnetic layer, and an upper pinned magnetic layer; an intermediate antiferromagnetic layer; an upper multilayer film including a lower pinned magnetic layer, a lower nonmagnetic layer, a free magnetic layer, an upper nonmagnetic layer, and an upper pinned magnetic layer; and an upper antiferromagnetic layer in that order from the bottom, wherein each of the pinned magnetic layer is formed by depositing a first pinned magnetic sublayer and a second pinned magnetic sublayer having different magnetic moments per unit area with an intermediate nonmagnetic sublayer therebetween, the magnetic moment being the product of the saturation magnetization and the film thickness (Ms×t), the magnetic moment per unit area of the second pinned magnetic sublayer is larger than the magnetic moment per unit area of the first pinned magnetic sublayer in the upper multilayer film, and the magnetic moment of the first pinned magnetic sublayer is larger than the magnetic moment per unit area of the second pinned magnetic sublayer in the lower multilayer film.

Alternatively, a method for making a magnetic sensing element of the present invention includes the steps of:

(d) depositing a lower antiferromagnetic layer; a lower multilayer film including a lower pinned magnetic layer including a first pinned magnetic sublayer, an intermediate nonmagnetic sublayer, and a second pinned magnetic sublayer, a lower nonmagnetic layer, a free magnetic layer, an upper nonmagnetic layer, and an upper pinned magnetic layer including a second pinned magnetic sublayer, an intermediate nonmagnetic sublayer, and a first pinned magnetic sublayer; a first intermediate antiferromagnetic layer; and a nonmagnetic protective layer composed of a noble metal, in that order from the bottom;

(e) annealing the laminate thus obtained in a first magnetic field to produce an exchange coupling magnetic field between each of the first pinned magnetic sublayers and the lower antiferromagnetic layer or the first intermediate antiferromagnetic layer so that the magnetization directions of the two first pinned magnetic sublayers are pinned in the same direction;

(f) partially or entirely removing the nonmagnetic protective layer;

(g) depositing a second intermediate antiferromagnetic layer on the nonmagnetic protective layer or the first intermediate antiferromagnetic layer to form an intermediate antiferromagnetic layer including the first intermediate antiferromagnetic layer and the second intermediate antiferromagnetic layer, and depositing an upper multilayer film including a lower pinned magnetic layer including a first pinned magnetic sublayer, an intermediate nonmagnetic sublayer, and a second pinned magnetic sublayer, a lower nonmagnetic layer, a free magnetic layer, an upper nonmagnetic layer, and an upper pinned magnetic layer including a second pinned magnetic sublayer, an intermediate nonmagnetic sublayer, and a first pinned magnetic sublayer, and an upper antiferromagnetic layer in that order on the intermediate antiferromagnetic layer; and (h) annealing the laminate thus obtained in a second magnetic field to produce an exchange coupling magnetic field between each of the first pinned magnetic sublayers and the second intermediate antiferromagnetic layer or the upper antiferromagnetic layer, and the magnetization direction of the first pinned magnetic sublayers in the upper multilayer film is pinned antiparallel to the magnetization direction of the first pinned magnetic sublayers in the lower multilayer film.

In the fabrication method of the present invention, the lower multilayer film is annealed in the first magnetic field and the magnetization directions of the first pinned magnetic sublayers in the lower multilayer film are pinned in a predetermined direction, and the upper multilayer film is then formed. Annealing in the second magnetic field is performed to produce an exchange coupling magnetic field between each of the first pinned magnetic sublayers in the upper multilayer film and the upper antiferromagnetic layer or the second intermediate antiferromagnetic layer.

Thereby, the magnetization of the first pinned magnetic sublayers of the upper multilayer film can be pinned antiparallel to the magnetization of the first pinned magnetic sublayers of the lower multilayer film, and thus the magnetization direction of the second pinned magnetic sublayers facing the free magnetic layer in the upper multilayer film can be set antiparallel to the magnetization direction of the second pinned magnetic sublayers facing the free magnetic layer in the lower multilayer film.

Consequently, the magnetic sensing element fabricated by this method can also output a pulsed signal when moving over the magnetization transition region of the recording medium. In particular, when a leakage magnetic field signal from a perpendicular recording medium which is magnetized perpendicular to the plane is read, a pulsed signal can be directly output.

In the fabrication method of the present invention, after the magnetization directions of the two first pinned magnetic sublayers in the lower multilayer film are pinned in the same direction in step (e), the nonmagnetic protective layer is partially or entirely removed.

In the present invention, since the nonmagnetic protective layer is composed of a noble metal, even if the nonmagnetic protective layer is formed thinly, a satisfactory oxidation-inhibiting effect is exhibited, and the nonmagnetic protective layer can be removed by ion milling with low energy. Therefore, the first intermediate antiferromagnetic layer can be protected from damage by ion milling.

Additionally, ion milling with low energy is defined as ion milling using a beam of ions with a beam voltage (accelerating voltage) of less than 1,000 V. For example, a beam voltage of 150 to 500 V may be used.

In the present invention, in step (d), preferably, the nonmagnetic protective layer is formed at a thickness of 3 to 10 Å. If the nonmagnetic protective layer is thin to such a degree, the thickness of the nonmagnetic protective layer can be easily adjusted by trimming by ion milling with low energy in step (f), and there is no possibility that the first intermediate antiferromagnetic layer under the nonmagnetic protective layer is damaged during ion milling.

Preferably, the nonmagnetic protective layer is composed of at least one element selected from the group consisting of Ru, Re, Pd, Os, Ir, Pt, Au, and Rh.

Preferably, in step (f), the nonmagnetic protective layer is trimmed until the thickness of the nonmagnetic protective layer is 3 Å or less, or the nonmagnetic protective layer is entirely removed.

Consequently, an antiferromagnetic interaction is caused between the second intermediate antiferromagnetic layer formed in step (g) and the first intermediate antiferromagnetic layer, and the first intermediate antiferromagnetic layer and the second intermediate antiferromagnetic layer are combined to form an antiferromagnetic layer. Thereby, the magnetization direction of the first pinned magnetic sublayer can be pinned properly.

Alternatively, a method for making a magnetic sensing element of the present invention includes the steps of:

(i) depositing a lower antiferromagnetic layer; a lower multilayer film including a lower pinned magnetic layer including a first pinned magnetic sublayer, an intermediate nonmagnetic sublayer, and a second pinned magnetic sublayer, a lower nonmagnetic layer, a free magnetic layer, an upper nonmagnetic layer, and an upper pinned magnetic layer including a second pinned magnetic sublayer, an intermediate nonmagnetic sublayer, and a first pinned magnetic sublayer; a first intermediate antiferromagnetic layer; and a hard magnetic layer, in that order from the bottom;

(j) annealing the laminate thus obtained in a first magnetic field to produce an exchange coupling magnetic field between each of the first pinned magnetic sublayers and the lower antiferromagnetic layer or the first intermediate antiferromagnetic layer so that the magnetization directions of the two first pinned magnetic sublayers are pinned in the same direction;

(k) depositing a second intermediate antiferromagnetic layer on the hard magnetic layer, and depositing an upper multilayer film including a lower pinned magnetic layer including a first pinned magnetic sublayer, an intermediate nonmagnetic sublayer, and a second pinned magnetic sublayer, a lower nonmagnetic layer, a free magnetic layer, an upper nonmagnetic layer, and an upper pinned magnetic layer including a second pinned magnetic sublayer, an intermediate nonmagnetic sublayer, and a first pinned magnetic sublayer, and an upper antiferromagnetic layer in that order on the second intermediate antiferromagnetic layer; and (l) annealing the laminate thus obtained in a second magnetic field to produce an exchange coupling magnetic field between each of the first pinned magnetic sublayers and the second intermediate antiferromagnetic layer or the upper antiferromagnetic layer, and the magnetization direction of the first pinned magnetic sublayers in the upper multilayer film is pinned antiparallel to the magnetization direction of the first pinned magnetic sublayers in the lower multilayer film.

In the fabrication method described above, the lower multilayer film is annealed in the first magnetic field and the magnetization directions of the first pinned magnetic sublayers in the lower multilayer film are pinned in a predetermined direction, and the upper multilayer film is then formed. Annealing in the second magnetic field is performed to produce an exchange coupling magnetic field between each of the first pinned magnetic sublayers in the upper multilayer film and the upper antiferromagnetic layer or the second intermediate antiferromagnetic layer.

Thereby, the magnetization direction of the first pinned magnetic sublayers in the upper multilayer film can be pinned antiparallel to the magnetization direction of the first pinned magnetic sublayers in the lower multilayer film, and thus the magnetization direction of the second pinned magnetic sublayers facing the free magnetic layer in the upper multilayer film can be set antiparallel to the magnetization direction of the second pinned magnetic sublayers facing the free magnetic layer in the lower multilayer film.

Consequently, the magnetic sensing element fabricated by this method can also output a pulsed signal when moving over the magnetization transition region of the recording medium. In particular, when a leakage magnetic field signal from a perpendicular recording medium which is magnetized perpendicular to the plane is read, a pulsed signal can be directly output.

In the present invention, the hard magnetic layer functions as a so-called in-stack bias layer. Magnetostatic coupling occurs between the ends of the hard magnetic layer and the ends of the free magnetic layers, and thereby the magnetization directions of the free magnetic layers are aligned in one direction.

If the hard magnetic layer functioning as the in-stack bias layer is formed between the two multilayer films, it is possible to provide longitudinal bias magnetic fields of uniform magnitude to the free magnetic layers formed in the two multilayer films.

In the two fabrication methods in which annealing in the first magnetic field and annealing in the second magnetic field are performed, preferably, annealing in the first magnetic field is performed in a magnetic field that is larger than the saturation magnetic field of the pinned magnetic layer, and annealing in the second magnetic field is performed in a magnetic field that is larger than the coercive force and smaller than spin-flop magnetic field of the pinned magnetic layer.

Thereby, without changing the magnetization direction of the first pinned magnetic sublayers in the lower multilayer film, the magnetization of the first pinned magnetic sublayers in the upper multilayer film can be pinned antiparallel to the magnetization direction of the first pinned magnetic sublayers in the lower multilayer film.

By using either fabrication method in which annealing in the first magnetic field and annealing in the second magnetic field are performed, all of the first pinned magnetic sublayers constituting the individual pinned magnetic layers can be formed with the same thickness, and all the second pinned magnetic sublayers can be formed with the same thickness.

The two free magnetic layers constituting the two multilayer films preferably have the same thickness, and the four nonmagnetic layers preferably have the same thickness. Furthermore, all of the three or four antiferromagnetic layers preferably have the same thickness.

If the two multilayer films include the pinned magnetic layers, the free magnetic layers, the nonmagnetic layers, and the antiferromagnetic layers, each having the same thickness, the two multilayer films have the same electrical resistance and the same rate of change in magnetoresistance. When a leakage magnetic field is applied in the same direction to the two multilayer films, the changes in voltage cancel each other out accurately. Therefore, when a pulsed signal is not output and a constant voltage is output, the voltage output in the case of upward magnetic field from the medium can be accurately matched to the voltage output in the case of downward magnetic field from the medium. Therefore, the constant baseline (zero level) can be maintained.

In particular, if the two antiferromagnetic layers sandwiching the hard magnetic layer which functions as the in-stack bias layer have the same thickness, since the distance between the free magnetic layer and the hard magnetic layer in one multilayer is equal to the distance between the free magnetic layer and the hard magnetic layer in the other multilayer, longitudinal bias magnetic fields with the same magnitude are applied to the individual free magnetic layers, thus being advantageous.

By providing an electrode layer on the bottom of the lower antiferromagnetic layer and an electrode layer on the top of the upper antiferromagnetic layer, a magnetic sensing element can be produced in which a current flows perpendicular to the planes of the two multilayer films and three antiferromagnetic layers.

DESCRIPTION OF THE PREFERRED EMBODIMENTS

Figure 1:
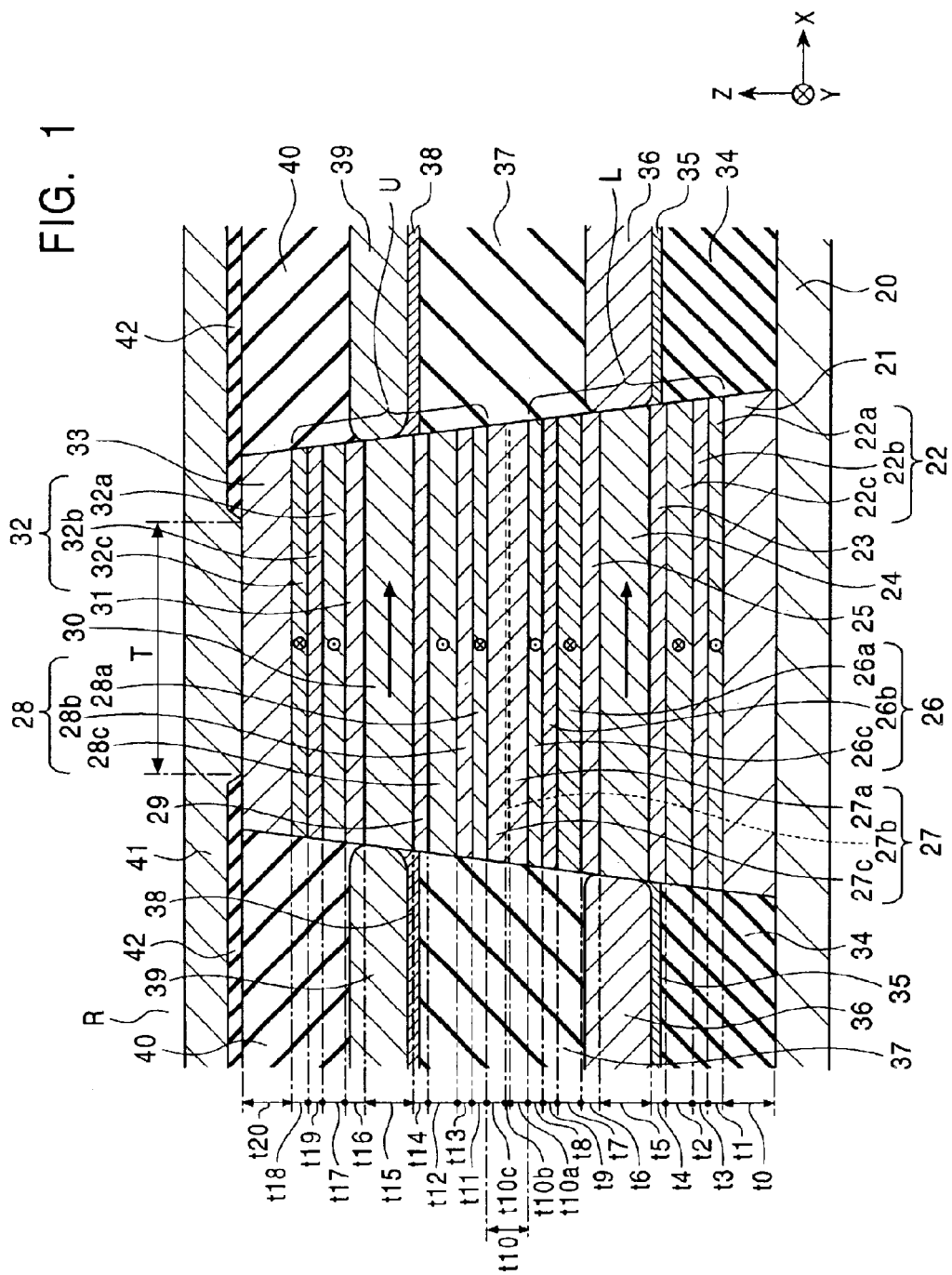
FIG. 1 is a sectional view of a magnetic sensing element in a first embodiment of the present invention.

FIG. 1 is a partial sectional view of a magnetic sensing element in a first embodiment of the present invention, viewed from a surface facing a recording medium. In FIG. 1, only the central part of the element is shown.

A magnetic sensing element R shown in FIG. 1 is a MR head for reading external signals recorded in the recording medium. The surface facing the recording medium is perpendicular to the plane of the thin film constituting the magnetic sensing element and parallel to the magnetization directions of free magnetic layers of the magnetic sensing element in the absence of an applied external magnetic field. In FIG. 1, the surface facing the recording medium is parallel to the X-Z plane.

Additionally, when the magnetic sensing element is used for a floating-type magnetic head, the surface facing the recording medium corresponds to a so-called ABS.

The magnetic sensing element is formed on the trailing end of a slider, for example, composed of alumina-titanium carbide ($Al_2O_3$—TiC). The slider is connected to an elastically deformable support composed of a stainless steel or the like at a surface opposite to the surface facing the recording medium, and thus a magnetic head device is produced.

The recording medium travels in the Z direction. The leakage magnetic field from the recording medium is oriented in the Y direction (in the height direction).

A first electrode layer 20 is, for example, composed of α-Ta, Au, Cr, Cu, or W.

An antiferromagnetic layer 21 is formed on the central region of the first electrode layer 20. The antiferromagnetic layer 21 is preferably composed of an antiferromagnetic material containing X and Mn, where X is at least one element selected from the group consisting of Pt, Pd, Ir, Rh, Ru, and Os. Alternatively, the antiferromagnetic layer 21 is preferably composed of an antiferromagnetic material containing X, X', and Mn, where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Such antiferromagnetic materials exhibit superior corrosion resistance and high blocking temperatures and can generate large exchange coupling magnetic fields at the interface with a first pinned magnetic sublayer 22a of a pinned magnetic layer 22, which will be described below. Preferably, the antiferromagnetic layer 21 has a thickness of 50 to 250 Å.

Additionally, an underlayer composed of Ta or the like and a seed layer composed of a NiFe alloy or the like may be disposed between the first electrode layer 20 and the antiferromagnetic layer 21. The seed layer is mainly composed of face-centered-cubic crystal, and the (111) plane is preferentially oriented parallel to the interface with the antiferromagnetic layer 21. The seed layer may be composed of Cr or a Ni—Fe—Y alloy, where Y is at least one element selected from the group consisting of Cr, Rh, Ta, Hf, Nb, Zr, and Ti. In the seed layer composed of such a material, the (111) plane is easily preferentially oriented parallel to the interface with the antiferromagnetic layer 21 if it is formed on the underlayer composed of Ta or the like. The seed layer has a thickness of approximately 30 Å.

Since the magnetic sensing element R is a CPP type in which a sensing current flows perpendicular to the plane of each layer, the sensing current must flow through the seed layer properly. Therefore, the seed layer is preferably composed of a material whose resistivity is not high. That is, in the CPP type, the seed layer is preferably composed of a material having low resistivity, such as a NiFe alloy or Cr.

The pinned magnetic layer 22 is formed on the antiferromagnetic layer 21. In this embodiment, the pinned magnetic layer 22 has a triple layer structure.

Each of a first pinned magnetic sublayer 22a and a second pinned magnetic sublayer 22c constituting the pinned magnetic layer 22 is composed of a magnetic material, such as Co, a CoFe alloy, a CoFeNi alloy, or a NiFe alloy. An intermediate nonmagnetic sublayer 22b which is interposed between the first pinned magnetic sublayer 22a and the second pinned magnetic sublayer 22c is composed of a nonmagnetic conductive material, such as at least one material selected from the group consisting of Ru, Rh, Ir, Cr, Re, and Cu. Due to such a structure, the magnetization directions of the first pinned magnetic sublayer 22a and the second pinned magnetic sublayer 22c are antiparallel to each other. That is, a so-called "synthetic ferrimagnetic state" is produced.

An exchange coupling magnetic field is produced between the antiferromagnetic layer 21 and the first pinned magnetic sublayer 22a by annealing in a magnetic field. For example, when the magnetization of the first pinned magnetic sublayer 22a is pinned in a direction antiparallel to the height direction (Y direction), the second pinned magnetic sublayer 22c is magnetized and pinned in the height direction by the RKKY interaction. Due to this construction, the magnetization of the pinned magnetic layer 22 can be stabilized, and the apparent exchange coupling magnetic field produced at the interface between the pinned magnetic layer 22 and the antiferromagnetic layer 21 can be increased.

Each of the thickness t1 of the first pinned magnetic sublayer 22a and the thickness t2 of the second pinned magnetic sublayer 22c is approximately 10 to 70 Å. The thickness t3 of the intermediate nonmagnetic sublayer 22b is approximately 3 to 10 Å.

The materials and thicknesses of the first pinned magnetic sublayer 22a and the second pinned magnetic sublayer 22c are adjusted so that the first pinned magnetic sublayer 22a and the second pinned magnetic sublayer 22c have different magnetic moments per unit area. The magnetic moment per unit area is defined as the product of the saturation magnetization (Ms) and the film thickness (t). For example, when the first pinned magnetic sublayer 22a and the second pinned magnetic sublayer 22c are composed of the same material with the same composition, by setting the thickness of the first pinned magnetic sublayer 22a to be different from the thickness of the second pinned magnetic sublayer 22c, different magnetic moments per unit area can be set for the first pinned magnetic sublayer 22a and the second pinned magnetic sublayer 22c. Thereby, the first pinned magnetic sublayer 22a and the second pinned magnetic sublayer 22c can be formed into a synthetic ferrimagnetic structure appropriately.

A nonmagnetic layer 23 is formed on the pinned magnetic layer 22. The nonmagnetic layer 23 is composed of a conductive material having low electrical resistance, such as Cu. The thickness t4 of the nonmagnetic layer 23 is, for example, approximately 25 Å.

A free magnetic layer 24 is formed on the nonmagnetic layer 23. The free magnetic layer 24 is composed of a NiFe alloy, a CoFeNi alloy, a CoFe alloy, Co, or the like. The thickness t5 of the free magnetic layer 24 is, for example, 30 to 100 Å.

A nonmagnetic layer 25 is formed on the free magnetic layer 24. The nonmagnetic layer 25 is composed of Cu or the like as in the case of the nonmagnetic layer 23. The thickness t6 of the nonmagnetic layer 25 is, for example, approximately 25 Å.

Additionally, a diffusion-preventing layer composed of Co or CoFe may be formed between the free magnetic layer 24 and the nonmagnetic layer 23 and/or the nonmagnetic layer 25 in order to prevent the material of the free magnetic layer 24 from being diffused into the nonmagnetic layer 23 or the nonmagnetic layer 25.

A pinned magnetic layer 26 is formed on the nonmagnetic layer 25. The pinned magnetic layer 26 has a synthetic ferrimagnetic structure as in the case of the pinned magnetic layer 22. Each of a second pinned magnetic sublayer 26a and a first pinned magnetic sublayer 26c constituting the pinned magnetic layer 26 is composed of a magnetic material, such as Co, a CoFe alloy, a CoFeNi alloy, or a NiFe alloy. An intermediate nonmagnetic sublayer 26b which is interposed between the second pinned magnetic sublayer 26a and the first pinned magnetic sublayer 26c is composed of a nonmagnetic conductive material, such as at least one material selected from the group consisting of Ru, Rh, Ir, Cr, Re, and Cu. Due to such a structure, the magnetization directions of the second pinned magnetic sublayer 26a and the first pinned magnetic sublayer 26c are antiparallel to each other.

In this embodiment, the first pinned magnetic sublayer 26c is in contact with an antiferromagnetic layer 27, which will be described below, and an exchange coupling magnetic field is produced. For example, when the magnetization direction of the first pinned magnetic sublayer 26c is pinned in a direction antiparallel to the height direction, the magnetization direction of the second pinned magnetic sublayer 26a is pinned in the height direction by the RKKY interaction.

The materials and thicknesses for the second pinned magnetic sublayer 26a and the first pinned magnetic sublayer 26c are also adjusted so that the second pinned magnetic sublayer 26a and the first pinned magnetic sublayer 26c have different magnetic moments (saturation magnetization Ms×film thickness t) per unit area.

Each of the thickness t7 of the second pinned magnetic sublayer 26a and the thickness t8 of the first pinned magnetic sublayer 26c is approximately 10 to 70 Å. The thickness t9 of the intermediate nonmagnetic sublayer 26b is approximately 3 to 10 Å.

The pinned magnetic layer 22, the nonmagnetic layer 23, the free magnetic layer 24, the nonmagnetic layer 25, and the pinned magnetic layer 26 constitute a lower multilayer film L which is one of the two multilayer films constituting the magnetic sensing element R in this embodiment.

An antiferromagnetic layer 27 is formed on the pinned magnetic layer 26. The antiferromagnetic layer 27 is, as in the case of the antiferromagnetic layer 21, preferably composed of an antiferromagnetic material containing X and Mn, where X is at least one element selected from the group consisting of Pt, Pd, Ir, Rh, Ru, and Os. Alternatively, the antiferromagnetic layer 21 is preferably composed of an antiferromagnetic material containing X, X', and Mn, where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Additionally, if the magnetic sensing element R shown in FIG. 1 is fabricated by a method which will be described below, the antiferromagnetic layer 27 has a multilayer structure including a first intermediate antiferromagnetic sublayer 27a, a nonmagnetic protective layer 27b composed of a noble metal with a thickness of 1 to 3 Å, and a second intermediate antiferromagnetic sublayer 27c.

The first intermediate antiferromagnetic sublayer 27a and the second intermediate antiferromagnetic sublayer 27c are composed of the same antiferromagnetic material, such as the PtMn alloy, X—Mn alloy, or Pt—Mn—X' alloy described above.

The thickness t10a of the first intermediate antiferromagnetic sublayer 27a is 50 to 250 Å, and, for example, 80 Å. The first intermediate antiferromagnetic sublayer 27a must have a thickness which exhibits antiferromagnetism alone, for example, a thickness of 50 Å or more. The second intermediate antiferromagnetic sublayer 27c may have a thickness which does not exhibit antiferromagnetism alone, for example, a thickness of 10 to 50 Å.

The nonmagnetic protective layer 27b has a small thickness of 1 to 3 Å and is composed of at least two elements selected from the group consisting of Ru, Re, Pd, Os, Ir, Pt, Au, and Rh. Thereby, an antiferromagnetic interaction is caused between the first intermediate antiferromagnetic sublayer 27a and the second intermediate antiferromagnetic sublayer 27c, and the first intermediate antiferromagnetic sublayer 27a and the second intermediate antiferromagnetic sublayer 27c function as a combined antiferromagnetic layer. Even if the material of the nonmagnetic protective layer 27b is diffused into the first intermediate antiferromagnetic sublayer 27a and the second intermediate antiferromagnetic sublayer 27c, antiferromagnetism is not degraded.

The antiferromagnetic layer 27 may have a structure including a first intermediate antiferromagnetic sublayer 27a and a second intermediate antiferromagnetic sublayer 27c without a nonmagnetic protective layer 27b. Alternatively, the antiferromagnetic layer 27 may be a single antiferromagnetic layer.

An upper multilayer film U which is one of the two multilayer films constituting the magnetic sensing element R is disposed on the antiferromagnetic layer 27. The upper multilayer film U includes a synthetic-ferrimagnetic-type pinned magnetic layer 28 including a first pinned magnetic sublayer 28a, an intermediate nonmagnetic sublayer 28b, and a second pinned magnetic sublayer 28c; a nonmagnetic layer 29; a free magnetic layer 30; a nonmagnetic layer 31; and a synthetic-ferrimagnetic-type pinned magnetic layer 32 including a second pinned magnetic sublayer 32a, an intermediate nonmagnetic sublayer 32b, and a first pinned magnetic sublayer 32c.

The materials for the individual layers constituting the upper multilayer film U are the same as those for the corresponding individual layers constituting the lower multilayer film L.

An antiferromagnetic layer 33 which is in contact with the first pinned magnetic sublayer 32c is formed on the upper multilayer film U. The antiferromagnetic layer 33 is, as in the case of the antiferromagnetic layers 21 and 27, preferably composed of an antiferromagnetic material containing X and Mn, where X is at least one element selected from the group consisting of Pt, Pd, Ir, Rh, Ru, and Os. Alternatively, the antiferromagnetic layer 33 is preferably composed of an antiferromagnetic material containing X, X', and Mn, where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Additionally, if a fabrication method which will be described below is used, it is possible to form all of the antiferromagnetic layer 21, the antiferromagnetic layer 27, and the antiferromagnetic layer 33 in the magnetic sensing element R using an antiferromagnetic material having the same composition.

As shown in FIG. 1, at each end in the track width direction (in the X direction) of the antiferromagnetic layer 21 and the pinned magnetic layer 22, an insulating layer 34 composed of $Al_2O_3$, $SiO_2$, or the like, is formed on the first electrode layer 20. In this embodiment, the upper surface of the insulating layer 34 is lower than the lower surface of the free magnetic layer 24.

A bias underlayer 35 is formed on each insulating layer 34. A hard bias layer 36 is formed on each bias underlayer 35 at the position facing the end face of the free magnetic layer 24.

The bias underlayer 35 is preferably composed of a metal film having a body-centered cubic (bcc) crystal structure. In such a case, preferably, in the crystal orientation of the bias underlayer 35, the (100) plane is preferentially oriented.

The hard bias layer 36 is composed of a CoPt alloy, a CoPtCr alloy, or the like. In the crystal phase of such an alloy, the face-centered cubic (fcc) structure and the hexagonal close-packed (hcp) structure are mixed.

The lattice constant of the hcp structure of the CoPt-based alloy constituting the hard bias layer 36 is close to the lattice constant of the metal film constituting the bias underlayer 35. Therefore, in the CoPt-based alloy, the fcc structure is not easily formed and the hcp structure is easily formed. In such a case, the c-axis of the hcp structure is preferentially oriented within the boundary between the CoPt-based alloy and the bias underlayer 35. Since the hcp structure has a larger magnetic anisotropy in the c-axis direction compared to the fcc structure, the coercive force $H_c$ is increased when a magnetic field is applied to the hard bias layer 36. Moreover, since the c-axis of the hcp structure is preferentially oriented within the boundary between the CoPt-based alloy and the bias underlayer 35, the remanence is increased, and the remanence ratio S, which is the ratio of the remanence to the saturation magnetization, is increased. As a result, the characteristics of the hard bias layer 36 can be improved, and the bias magnetic field produced from the hard bias layer 36 can be increased.

In the present invention, the metal film having the body-centered cubic (bcc) crystal structure is preferably composed of at least one element selected from the group consisting of Cr, W, Mo, V, Mn, Nb, and Ta. Additionally, in the present invention, the bias underlayer 35 may be omitted.

In this embodiment, the upper surface of the hard bias layer 36 is located higher than the upper surface of the free magnetic layer 24.

An insulating layer 37 composed of $Al_2O_3$, $SiO_2$, or the like is formed on the hard bias layer 36. A bias underlayer 38 is formed on the insulating layer 37, and a hard bias layer 39 is formed on the bias underlayer 38 so as to face the end face of the free magnetic layer 30. The bias underlayer 38 is composed of the same material as that for the bias underlayer 35, and the hard bias layer 39 is composed of the same material as that for the hard bias layer 36.

An insulating layer 40 composed of $Al_2O_3$, $SiO_2$, or the like is formed on the hard bias layer 39.

A second electrode layer 41 is formed over the insulating layer 40 and the antiferromagnetic layer 33. The second electrode layer 41 is composed of $\alpha$-Ta, Au, Cr, Cu, W, or the like, as in the case of the first electrode layer 20.

Although not shown in the drawing, a lower shielding layer composed of a soft magnetic material, such as NiFe, is provided in contact with the lower surface of the electrode layer 20, and an upper shielding layer composed of a soft magnetic material, such as NiFe, is provided in contact with the upper surface of the electrode layer 41. Since the soft magnetic material, such as NiFe, is electrically conductive, the lower shielding layer may be formed directly on the lower surface of the antiferromagnetic layer 21 so as to act as an electrode layer, and the upper shielding layer may be formed directly on the antiferromagnetic layer 33 so as to act as an electrode layer.

The magnetic sensing element R is a so-called current-perpendicular-to-plane (CPP) magnetic sensing element in which a sensing current from the electrode layer 20 or 41 flows perpendicular to the planes of the individual layers in the upper multilayer film U and the lower multilayer film L.

In the magnetic sensing element R, two so-called dual spin-valve multilayer films are connected in series, each including a pinned magnetic layer, a nonmagnetic layer, a free magnetic layer, a nonmagnetic layer, and a pinned magnetic layer deposited from the bottom, and antiferromagnetic layers are provided between the multilayer films, on the lower surface of the lower multilayer film, and on the upper surface of the upper multilayer film.

In the magnetic sensing element R shown in FIG. 1, when a leakage magnetic field from the recording medium enters the magnetic sensing element R in the Y direction and the magnetization of the free magnetic layer is varied, an electrical resistance changes due to the relationship between the varied magnetization direction and the pinned magnetization direction of the pinned magnetic layer, and the leakage magnetic field is detected by a voltage change based on the change in the electrical resistance.

In the magnetic sensing element R shown in FIG. 1, the insulating layers 42 composed of $Al_2O_3$, $SiO_2$, or the like extend over both ends in the track width direction (X direction) of the antiferromagnetic layer 33, and a distance T is provided between the insulating layers 42. In this way, if the insulating layer 42 is interposed between each end of the antiferromagnetic layer 33 and the second electrode layer 41, the sensing current from the second electrode layer 41 flows through only the upper multilayer film U and lower multilayer film L within the distance T.

Consequently, even if the actual element size is increased, the current path into the upper multilayer film U and the lower multilayer film L can be narrowed and the element size that substantially contributes to the magnetoresistance effect (effective element size) can be decreased. Therefore, even if an upper multilayer film U, a lower multilayer film L, and antiferromagnetic layers 21, 27, and 33 of large size are formed with the precision of commonly used photolithography, it is possible to produce a magnetic sensing element having a large read output effectively.

The features of the construction of the magnetic sensing element R in this embodiment will be described. The magnetic sensing element R is characterized by the configuration of the magnetization directions of the pinned magnetic layers.

In the lower multilayer film L, the magnetization direction of the first pinned magnetic sublayer 22a of the synthetic-ferrimagnetic-type pinned magnetic layer 22 is pinned in a direction antiparallel to the Y direction by the exchange coupling magnetic field with the antiferromagnetic layer 21, and the magnetization direction of the second pinned magnetic sublayer 22c is pinned in the Y direction. Similarly, the magnetization direction of the first pinned magnetic sublayer 26c is pinned in a direction antiparallel to the Y direction by the exchange coupling magnetic field with the antiferromagnetic layer 27, and the second magnetic sublayer 26a is pinned in the Y direction.

In the pinned magnetic layer 22, since the magnetic moment (Ms×t) per unit area of the second pinned magnetic sublayer 22c is larger than the magnetic moment (Ms×t) per unit area of the first pinned magnetic sublayer 22a, the magnetization direction of the pinned magnetic layer 22, which corresponds to the direction of the resultant magnetic moment (Ms×t) per unit area, is the Y direction. In the pinned magnetic layer 26, since the magnetic moment (Ms×t) per unit area of the second pinned magnetic sublayer 26a is larger than the magnetic moment (Ms×t) per unit area of the first pinned magnetic sublayer 26c, the magnetization direction of the pinned magnetic layer 26, which corresponds to the direction of the resultant magnetic moment (Ms×t) per unit area, is the Y direction.

In FIG. 1, the first pinned magnetic sublayer 22a, the second pinned magnetic sublayer 22c, the first pinned magnetic sublayer 26c, and the second pinned magnetic sublayer 26a are formed using the same material so as to have different thicknesses, and thereby the magnetic moment (Ms×t) per unit area of each pinned magnetic sublayer is adjusted.

On the other hand, in the upper multilayer film U, the magnetization direction of the first pinned magnetic sublayer 28a of the synthetic-ferrimagnetic-type pinned magnetic layer 28 is pinned in the Y direction by the exchange coupling magnetic field with the antiferromagnetic layer 27, and the magnetization direction of the second pinned magnetic sublayer 28c is pinned in a direction antiparallel to the Y direction. Similarly, the magnetization direction of the first pinned magnetic sublayer 32c is pinned in the Y direction by the exchange coupling magnetic field with the antiferromagnetic layer 33, and the second pinned magnetic sublayer 32a is pinned in a direction antiparallel to the Y direction.

In the pinned magnetic layer 28, since the magnetic moment (Ms×t) per unit area of the second pinned magnetic sublayer 28c is larger than the magnetic moment (Ms×t) per unit area of the first pinned magnetic sublayer 28a, the magnetization direction of the pinned magnetic layer 28, which corresponds to the direction of the resultant magnetic moment (Ms×t) per unit area, is a direction antiparallel to the Y direction. In the pinned magnetic layer 32, since the magnetic moment (Ms×t) per unit area of the second pinned magnetic sublayer 32a is larger than the magnetic moment (Ms×t) per unit area of the first pinned magnetic sublayer 32c, the magnetization direction of the pinned magnetic layer 32, which corresponds to the direction of the resultant magnetic moment (Ms×t) per unit area, is a direction antiparallel to the Y direction.

In FIG. 1, the first pinned magnetic sublayer 28a, the second pinned magnetic sublayer 28c, the first pinned magnetic sublayer 32c, and the second pinned magnetic sublayer 32a are formed using the same material so as to have different thicknesses, and thereby the magnetic moment (Ms×t) per unit area of each pinned magnetic sublayer is adjusted.

As described above, in the magnetic sensing element R shown in FIG. 1, the magnetization direction of the second magnetic sublayers facing one free magnetic layer is antiparallel to the magnetization direction of the second magnetic sublayers facing the other free magnetic layer.

In the synthetic-ferrimagnetic-type pinned magnetic layers 22, 26, 28, and 32, the demagnetizing fields (dipole magnetic fields) due to the pinned magnetization of the first pinned magnetic sublayers 22a, 26c, 28a, and 32c, and the second pinned magnetic sublayers 22c, 26a, 28c, and 32a can be cancelled because the magnetostatic coupling magnetic fields of the first pinned magnetic sublayers 22a, 26c, 28a, and 32c, and the second pinned magnetic sublayers 22c, 26a, 28c, and 32a counteract each other. As a result, the contribution of the demagnetizing fields (dipole magnetic fields) by the pinned magnetizations of the pinned magnetic layers 22, 26, 28, and 32 to the variable magnetizations of the free magnetic layers 24 and 30 can be reduced.

Consequently, the variable magnetizations of the free magnetic layers 24 and 30 are more easily adjusted in a desired direction, and it is possible to obtain a spin-valve thin-film magnetic element which exhibits superior symmetry of a regenerated output waveform with little asymmetry.

Herein, asymmetry is defined as the degree of asymmetry of a regenerated output waveform, and if the waveform is symmetrical, the asymmetry is decreased. Therefore, as the asymmetry is brought closer to zero, the regenerated output waveform exhibits more superior symmetry.

The asymmetry is zero when the direction of the variable magnetization of the free magnetic layer and the direction of the pinned magnetization of the pinned magnetic layer are perpendicular to each other. When the asymmetry is greatly increased, it is not possible to read the data accurately from the media, resulting in an error. Therefore, as the asymmetry is brought closer to zero, the reliability of processing regenerated signals is improved, resulting in a superior spin-valve thin-film magnetic element.

The demagnetizing fields (dipole magnetic fields) by the pinned magnetizations of the pinned magnetic layers 22, 26, 28, and 32 have a nonuniform distribution in which the values are large at the ends and small in the center in the element height direction of the free magnetic layers 24 and 39, and in some cases, the free magnetic layers 24 and 30 may be prevented from being aligned in a single-domain state. However, by using the pinned magnetic layers 22, 26, 28, and 32 having the laminated structure described above, the dipole magnetic fields can be decreased, and thus nonuniform distribution of the magnetization is prevented from occurring due to the formation of domain walls in the free magnetic layers 24 and 30, and thus it is possible to prevent Barkhausen noise, etc. from occurring.

The magnetization directions of the free magnetic layers 24 and 30 are aligned substantially perpendicular to the magnetization directions of the pinned magnetic layers 22, 26, 28, and 32. Preferably, the relative angle between the magnetization direction of the second pinned magnetic sublayer which directly contributes to the change in electrical resistance (output) and the magnetization direction of the free magnetic layer is orthogonal when a sensing current is applied and a signal magnetic field is not applied.

By adjusting the magnetization directions of the free magnetic layers 24 and 30 and the pinned magnetic layers 22, 26, 28, and 32 as described above, the magnetic sensing element R shown in FIG. 1 can output a pulsed signal directly when moving over a magnetization transition region.

Figure 2:
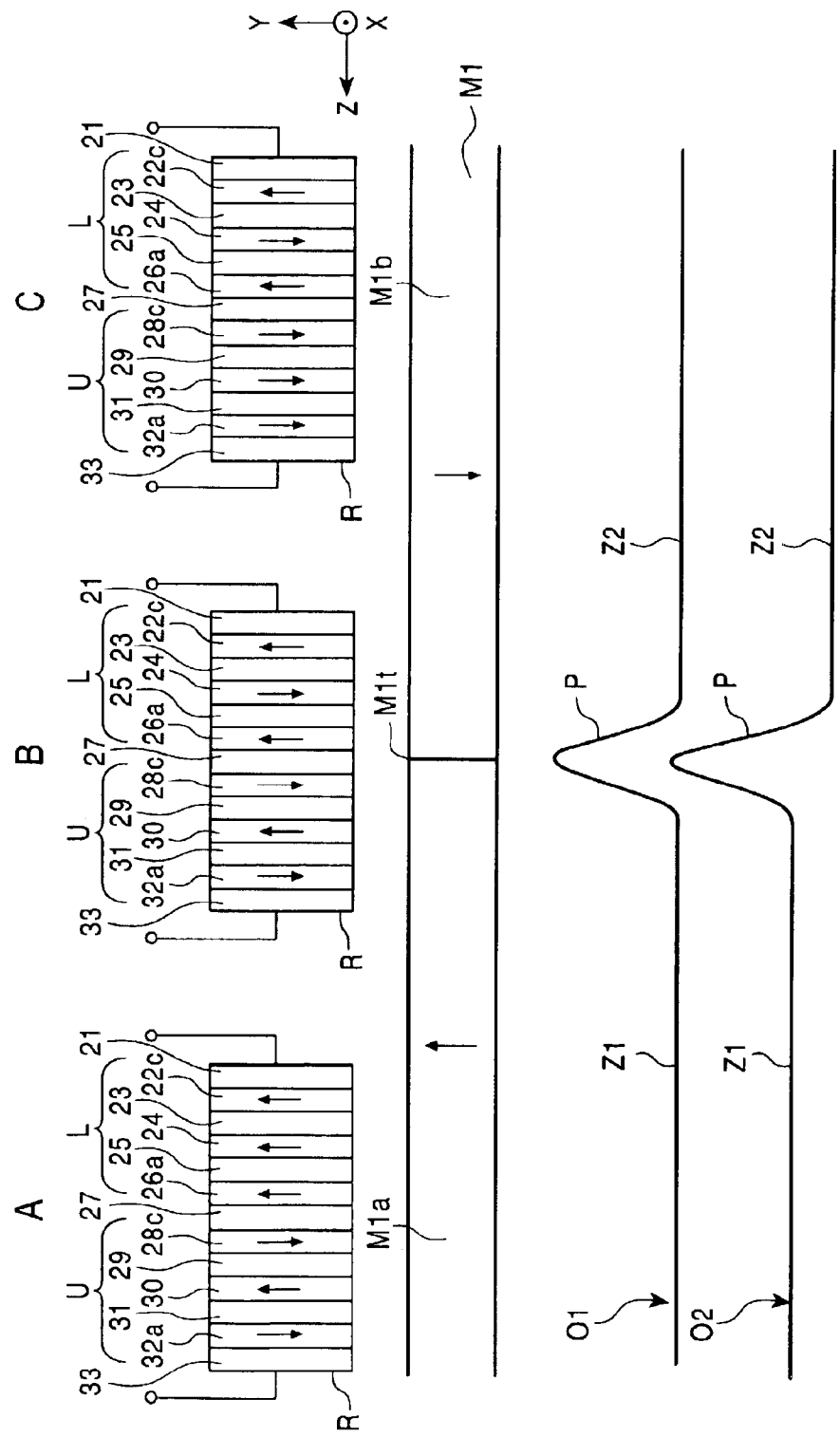
FIG. 2 is a schematic diagram showing a state in which the magnetic sensing element shown in FIG. 1 is reading signals recorded in a perpendicular magnetic recording medium.

FIG. 2 is a schematic diagram showing the state in which the magnetic sensing element R shown in FIG. 1 detects signal magnetic fields recorded in a planar recording medium which is magnetized perpendicular to the plane, i.e., a perpendicular magnetic recording medium.

In FIG. 2, only the second pinned magnetic sublayers 22c, 26a, 28c, and 32a which directly contribute to the magnetoresistance effect among the layers constituting the pinned magnetic layers 22, 26, 28, and 32 are shown.

In a state A in which the magnetic sensing element R is located above a region M1a of a recording medium M1 and a leakage magnetic field is applied to the upper multilayer film U and the lower multilayer film L in the same direction Y (direction of the leakage magnetic field from the recording medium, i.e., height direction), the magnetization directions of the free magnetic layers 24 and 30 are rotated toward the Y direction. As a result, the magnetization direction of the free magnetic layer 24 is varied so as to be parallel to the magnetization direction of the second pinned magnetic sublayer 22c which faces the free magnetic layer 24 with the nonmagnetic layer 23 therebetween and to the magnetization direction of the second pinned magnetic sublayer 26a which faces the free magnetic layer 24 with the nonmagnetic layer 25 therebetween. The magnetization direction of the free magnetic layer 30 is varied so as to be antiparallel to the magnetization direction of the second pinned magnetic sublayer 28c which faces the free magnetic layer 30 with the nonmagnetic layer 29 therebetween and to the magnetization direction of the second pinned magnetic sublayer 32a which faces the free magnetic layer 30 with the nonmagnetic layer 31 therebetween.

Consequently, resistance is decreased in the lower multilayer film L and resistance is increased in the upper multilayer film U. Moreover, since the lower multilayer film L and the upper multilayer film U are connected in series, the changes in voltage in the individual multilayer films cancel each other out. Therefore, when the magnetic sensing element R is located only above the region M1a of the recording medium, the voltage output from the magnetic sensing element is at the zero level.

In a state B in which the recording medium M1 moves in the Z direction and the magnetic sensing element R is located over a magnetization transition region M1t, a leakage magnetic field is applied in the Y direction to the upper multilayer film U and a leakage magnetic field is applied antiparallel to the Y direction to the lower multilayer film L.

At this stage, the magnetization direction of the free magnetic layer 24 is rotated so as to be antiparallel to the Y direction, and the magnetization direction of the free magnetic layer 30 is rotated so as to be parallel to the Y direction.

As a result, the magnetization direction of the free magnetic layer 24 is varied antiparallel to the magnetization direction of the second pinned magnetic sublayer 22c which faces the free magnetic layer 24 with the nonmagnetic layer 23 therebetween and to the magnetization direction of the second pinned magnetic sublayer 26a which faces the free magnetic layer 24 with the nonmagnetic layer 25 therebetween. The magnetization direction of the free magnetic layer 30 is varied antiparallel to the second pinned magnetic sublayer 28c which faces the free magnetic layer 30 with the nonmagnetic layer 29 therebetween and to the second pinned magnetic sublayer 32a which faces the free magnetic layer 30 with the nonmagnetic layer 31 therebetween.

Consequently, resistance is increased in both the lower multilayer film L and the upper multilayer film U, and moreover, since the lower multilayer film L and the upper multilayer film U are connected in series, the voltage output from the magnetic sensing element R is at the positive level.

In a state C in which the relative position between the magnetic sensing element R and the recording medium M1 is further changed and the magnetic sensing element R is located above a region M1b, the leakage magnetic field is applied to the upper multilayer film U and the lower multilayer film L antiparallel to the Y direction. Resistance is increased in the lower multilayer film L and resistance is decreased in the upper multilayer film U. Moreover, since the lower multilayer film L and the upper multilayer film U are connected in series, the changes in voltage in the individual multilayer films cancel each other out. Therefore, when the magnetic sensing element R is located only above the region M1b of the recording medium, the voltage output from the magnetic sensing element R is at the zero level.

That is, when the magnetic sensing element R moves over the magnetization transition region M1t, as shown in an output curve O1 in FIG. 2, a positive pulsed signal P can be directly output by the magnetic sensing element R. Therefore, unlike the conventional case, signal processing can be performed without passing the output from the magnetic sensing element R through a differentiation circuit, and superposition of noise can be suppressed, resulting in an increase in the S/N ratio of the magnetic sensing element R.

Moreover, in the magnetic sensing element R, since the dual spin-valve upper multilayer film U and the dual spin-valve lower multilayer film L are stacked, an output that is more than two times larger than the output of a magnetic sensing element including only one dual spin-valve multilayer film can be obtained. In particular, in the example which will be described below, a magnetic sensing element which has an output that is five times larger than the output of a magnetic sensing element including only one dual spin-valve multilayer film is shown.

Additionally, in the magnetic sensing element R shown in FIG. 1, the respective thicknesses t1, t8, t11, and t18 of the first pinned magnetic sublayers 22a, 26c, 28a, and 32c are equal to each other, i.e., t1=t8=t11=t18. The respective thicknesses t2, t7, t12, and t17 of the second pinned magnetic sublayers 22c, 26a, 28c, and 32a are equal to each other, i.e., t2=t7=t12=t17. The respective thicknesses t3, t9, t13, and t19 of the intermediate nonmagnetic sublayers 22b, 26b, 28b, and 32c are equal to each other, i.e., t3=t9=t13=t19.

Therefore, all of the four pinned magnetic layers 22, 26, 28, and 32 have the same thickness.

Furthermore, the thickness t5 of the free magnetic layer 24 constituting the lower multilayer film L is equal to the thickness t15 of the free magnetic layer 30 constituting the upper multilayer film U, i.e., t5=t15. The respective thicknesses t4, t6, t14, and t16 of the nonmagnetic layers 23, 25, 29, and 31 are equal to each other, i.e., t4=t6=t14=t16.

The respective thicknesses t0, t10, and t20 of the three antiferromagnetic layers 21, 27, and 33 are equal to each other, i.e., t0=t10=t20.

If the thicknesses of the pinned magnetic layers 22, 26, 28, and 32, the free magnetic layers 24 and 30, the non-magnetic layers 23, 25, 29, and 31, and the antiferromagnetic layers 21, 27, and 33 are adjusted as described above, the upper multilayer film U and the lower multilayer film L have the same electrical resistance and the same rate of change in magnetoresistance. When a leakage magnetic field is applied in the same direction to the upper multilayer film U and the lower multilayer film L (in the state A or C in FIG. 2), the changes in the voltage in the upper multilayer film U and the lower multilayer film L cancel each other out, and therefore, when a pulsed signal is not output and when a constant voltage is output, the voltage outputs Z1 and Z2 are easily set on the baseline (at the zero level) as shown in the output curve O1 in FIG. 2.

If the upper multilayer film U and the lower multilayer film L show different changes in magnetoresistance, as shown in the output curve O2 in FIG. 2, a phenomenon referred to as a baseline shift occurs, resulting in a difficulty in signal processing.

Additionally, since the antiferromagnetic layers are not directly related to the change in magnetoresistance, in this embodiment, the respective thicknesses t0, t10, and t20 are not necessarily equal to each other.

The line recording resolution of the magnetic sensing element R shown in FIG. 1 depends on the distance between the free magnetic layer 24 and the free magnetic layer 30. In the magnetic sensing element R shown in FIG. 1, the distance between the free magnetic layer 24 and the free magnetic layer 30 is 150 to 300 Å.

Instead of each of the free magnetic layers 24 and 30 shown in FIG. 1, a synthetic-ferrimagnetic-type free magnetic layer may be used, in which a first free magnetic sublayer and a second free magnetic sublayer composed of Co, a CoFe alloy, a CoFeN alloy, a NiFe alloy, or the like with different magnetic moments per unit area are laminated with an intermediate nonmagnetic sublayer composed of at least one nonmagnetic conductive material selected from the group consisting of Ru, Rh, Ir, Cr, Re, and Cu therebetween.

In such a case, since the magnetization directions of the first free magnetic sublayer and the second free magnetic sublayer are antiparallel to each other, in order to obtain detection output from the upper multilayer film U and the lower multilayer film L, the magnetization directions of the second pinned magnetic sublayer 22c and the second pinned magnetic sublayer 26a must be antiparallel to each other, and the magnetization directions of the second pinned magnetic sublayer 28c and the second pinned magnetic sublayer 32a must be antiparallel to each other.

In order to achieve the effect of the present invention, the magnetization directions of the second pinned magnetic sublayer 22c and the second pinned magnetic sublayer 32a must be then set antiparallel to each other.

In the case of the synthetic-ferrimagnetic-type free magnetic layer, even if the physical thickness of the free magnetic layer is increased, the resultant magnetic moment can be decreased and the magnetic thickness can be decreased. Consequently, the magnetization of the free magnetic layer can be rotated with high sensitivity in response to the external magnetic field, resulting in an improvement in read output.

Figure 3:
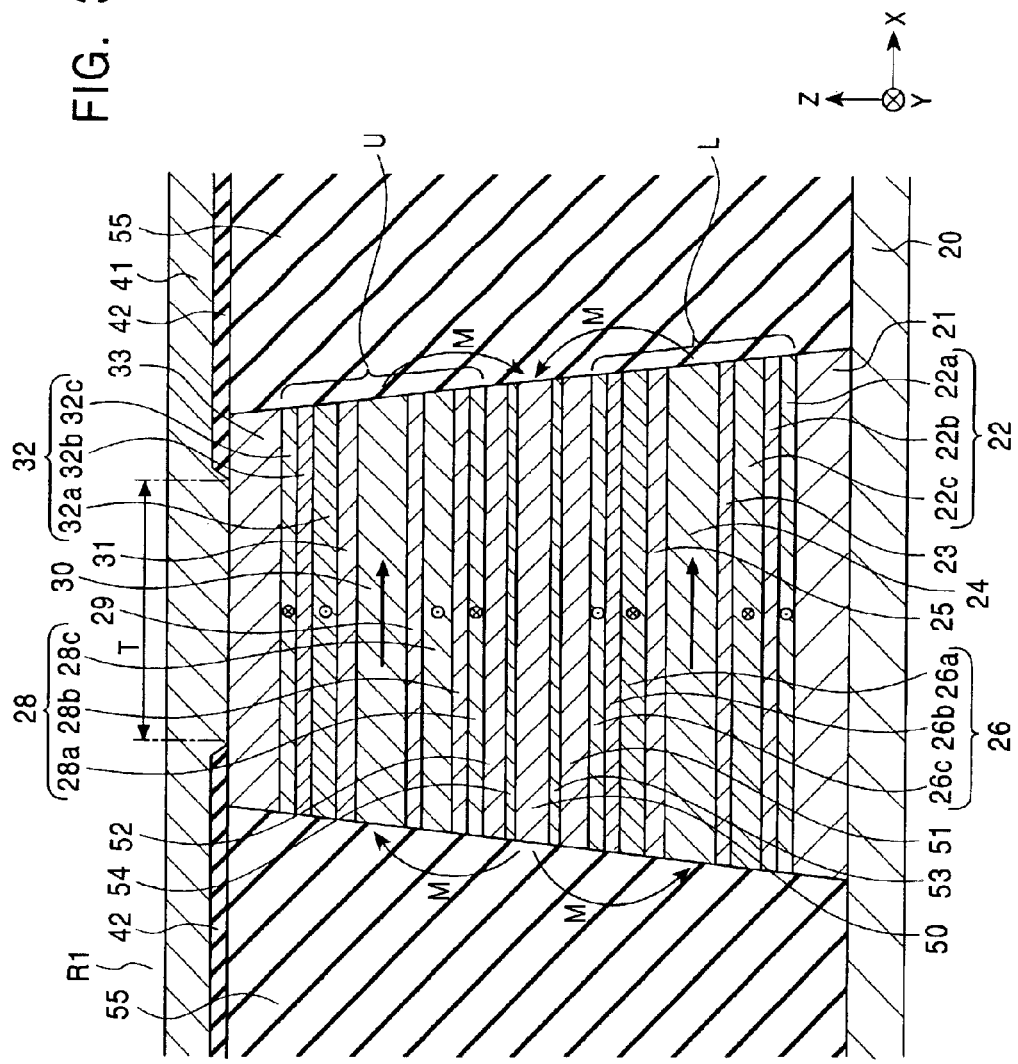
FIG. 3 is a sectional view of a magnetic sensing element in a second embodiment of the present invention.

FIG. 3 is a partial sectional view of a magnetic sensing element in a second embodiment of the present invention, viewed from a surface facing a recording medium. In FIG. 3, only the central part of the element is shown.

A magnetic sensing element R1 shown in FIG. 3 differs from the magnetic sensing element R shown in FIG. 1 in that two antiferromagnetic layers 51 and 52 sandwiching a hard magnetic layer 50 are formed between the upper multilayer film U and the lower multilayer film L, and hard bias layers facing the end faces of the free magnetic layers 24 and 30 are not included.

In the magnetic sensing element shown in FIG. 3, the layers represented by the same reference numerals as those in FIG. 1 are composed of the same materials and with the same thicknesses as those of the magnetic sensing element R shown in FIG. 1.

The antiferromagnetic layers 51 and 52 are composed of the same material with the same composition as those of the antiferromagnetic layers 21 and 33. The antiferromagnetic layers 51 and 52 have the same thickness.

The hard magnetic layer 50 is composed of CoPt or the like. The thickness of the hard magnetic layer 50 is preferably 50 to 300 Å.

Separating layers 53 and 54 composed of a nonmagnetic material are disposed between the hard magnetic layer 50 and the antiferromagnetic layer 51 and between the hard magnetic layer 50 and the antiferromagnetic layer 52, respectively, in order to prevent exchange coupling between the hard magnetic layer 50 and the antiferromagnetic layer 51 and between the hard magnetic layer 50 and the antiferromagnetic layer 52. Preferably, a NiFe alloy, a Ni—Fe—Y alloy, or Cr is used for forming the separating layer 54, where Y is at least one element selected from the group consisting of Cr, Rh, Ta, Hf, Nb, Zr, and Ti, so that the separating layer 54 may function as a seed layer for the antiferromagnetic layer 52. The separating layer 53 and the separating layer 54 have the same thickness. Preferably, the separating layer 53 is composed of Cr, W, or the like, and thereby the coercive force and remanence ratio of the hard magnetic layer 50 can be improved.

In the magnetic sensing element R1 shown in FIG. 3, the hard magnetic layer 50 functions as a so-called in-stack bias layer, and magnetostatic coupling M is generated between the end faces of the hard magnetic layer 50 and the end faces of the free magnetic layers 24 and 30. Consequently, the magnetization directions of the free magnetic layers 24 and 30 are aligned in one direction.

When the hard magnetic layer 50 which functions as the in-stack bias layer is formed between the upper multilayer film U and the lower multilayer film L as in the case of this embodiment, it is possible to apply longitudinal bias magnetic fields of uniform magnitude to the free magnetic layers 24 and 30 formed in the lower multilayer film L and the upper multilayer film U, respectively.

When the antiferromagnetic layers 51 and 52 sandwiching the hard magnetic layer 50 have the same thickness, the distance between the free magnetic layer 24 and the hard magnetic layer 50 is equal to the distance between the free magnetic layer 30 and the hard magnetic layer 50, and longitudinal bias magnetic fields with the same magnitude are applied to the free magnetic layers 24 and 30.

On the other hand, in the magnetic sensing element shown in FIG. 1 in which longitudinal bias magnetic fields are supplied to the free magnetic layers 24 and 30 by the hard bias layers 36 facing the end faces of the free magnetic layer 24 and the hard bias layers 39 facing the end faces of the free magnetic layer 30, it is difficult to apply longitudinal bias magnetic fields of uniform magnitude to the free magnetic layers 24 and 30.

The reason for this is that although the product of the thickness and remanence of the hard bias layer 36 must be exactly equal to the product of the thickness and remanence of the hard bias layer 39 in order to apply longitudinal bias magnetic fields of uniform magnitude to the free magnetic layers 24 and 30, it is difficult to form the hard bias layers 36 and the hard bias layers 39 so as to have the same product of the thickness and remanence. Additionally, it is difficult to form the hard bias layers adjoining the end faces of the free magnetic layers 24 and 30 so as to have the same positional relationship, the same shape, and the same effective volume.

Furthermore, in the magnetic sensing element R1 shown in FIG. 3, it is possible to prevent a buckling phenomenon in which demagnetizing fields occur in the free magnetic layers 24 and 30, and it is also possible to prevent insensitive regions in which magnetization reversal deteriorates because the magnetizations of the free magnetic layers 24 and 30 are strongly pinned in the vicinity of the end faces.

Therefore, alignment of the free magnetic layers 24 and 30 in a single domain state can be accelerated appropriately, satisfactory magnetization reversal of the free magnetic layers 24 and 30 in response to an external magnetic field can be achieved, and it is possible to produce a magnetic sensing element R1 with satisfactory read sensitivity and high stability in the regenerated output waveform.

In the magnetic sensing element R1 shown in FIG. 3, since the magnetization directions of the free magnetic layers 24 and 30 and the pinned magnetic layers 22, 26, 28, and 32 are adjusted in the same manner as that in the magnetic sensing element R shown in FIG. 1, the magnetic sensing element R1 can directly output a pulsed signal when moving over the magnetization transition region of the recording medium.

The thicknesses of the pinned magnetic layers 22, 26, 28, and 32, the free magnetic layers 24 and 30, the nonmagnetic layers 23, 25, 29, and 31, and the antiferromagnetic layers 21 and 33 are adjusted in the same manner as that in the magnetic sensing element R shown in FIG. 1.

By the adjustment of the thicknesses of the individual layers and by supplying longitudinal bias magnetic fields of uniform magnitude to the free magnetic layers 24 and 30, the upper multilayer film U and the lower multilayer film L have the same electrical resistance and the same rate of change in magnetoresistance. When a leakage magnetic field is applied in the same direction to the upper multilayer film U and the lower multilayer film L (in the state A or C in FIG. 2), the changes in the voltage in the upper multilayer film U and the lower multilayer film L cancel each other out accurately.

Therefore, when the magnetic sensing element R1 does not output a pulsed signal and outputs a constant voltage, the voltage output is easily set at the zero level.

Moreover, in this embodiment, since the dual spin-valve upper multilayer film U and the dual spin-valve lower multilayer film L are stacked, an output that is more than two times larger than the output of a magnetic sensing element including only one dual spin-valve multilayer film can be obtained. In particular, in the example which will be described below, a magnetic sensing element which has an output that is five times larger than the output of a magnetic sensing element including only one dual spin-valve multi-layer film is shown.

Figure 4:
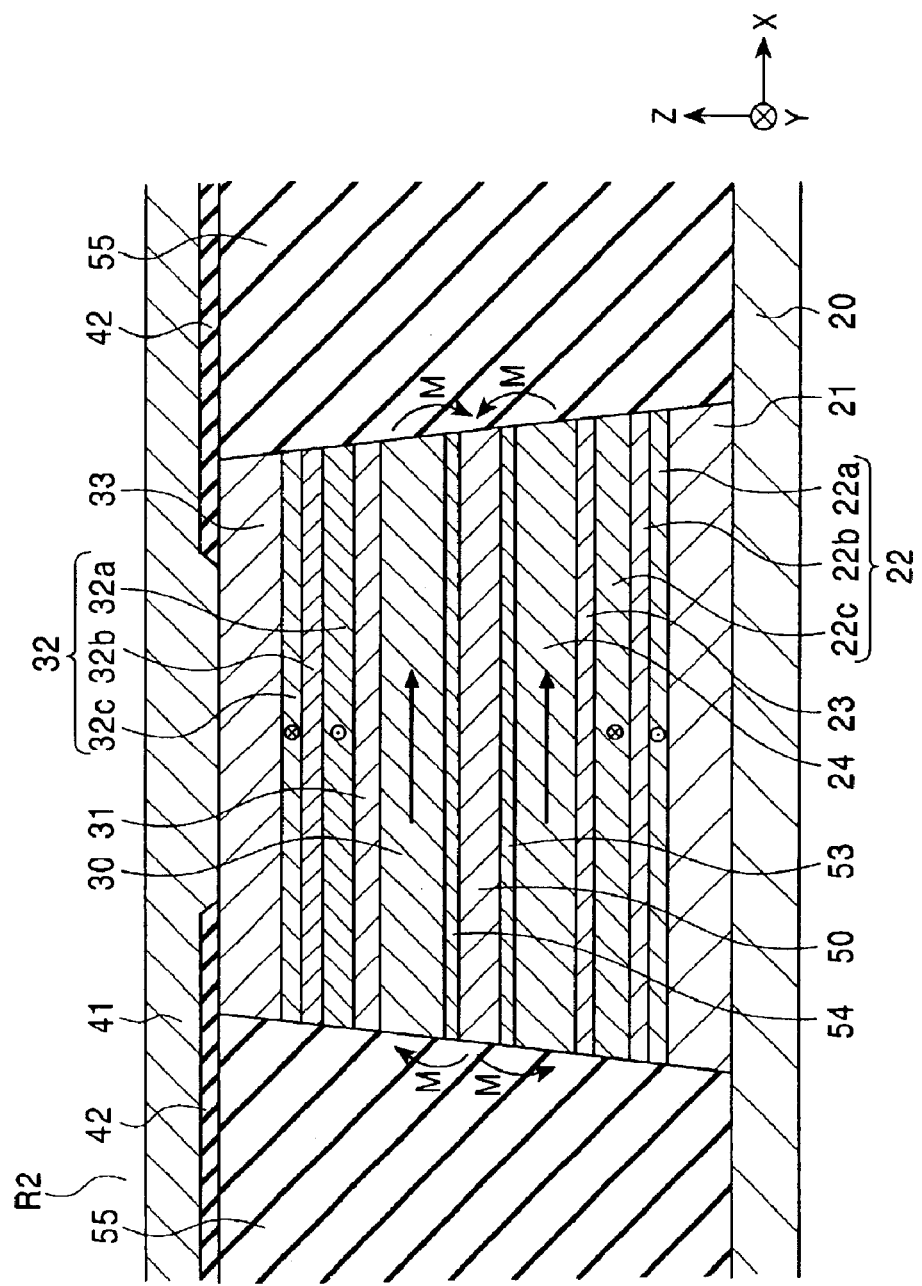
FIG. 4 is a sectional view of a magnetic sensing element with a structure in which antiferromagnetic layers 51 and 52, pinned magnetic layers 26 and 28, and nonmagnetic layers 25 and 29 are excluded from the layer structure of the magnetic sensing element shown in FIG. 3.

FIG. 4 is a sectional view of a magnetic sensing element R2 with a structure in which the antiferromagnetic layers 51 and 52, the pinned magnetic layers 26 and 28, and the nonmagnetic layers 25 and 29 are excluded from the layer structure of the magnetic sensing element shown in FIG. 3.

That is, in the magnetic sensing element R2 shown in FIG. 4, a free magnetic layer in a dual spin-valve magnetic sensing element is separated into two and a hard magnetic layer functioning as an in-stack bias layer is inserted between the separated two free magnetic layer.

In the magnetic sensing element R2 shown in FIG. 4, the hard magnetic layer 50 also functions as an in-stack bias layer, and magnetostatic coupling M is generated between the end faces of the hard magnetic layer 50 and the end faces of the free magnetic layers 24 and 30. Consequently, the magnetization directions of the free magnetic layers 24 and 30 are aligned in one direction.

In the construction in which longitudinal bias magnetic fields are applied by the hard magnetic layer 50 functioning as the in-stack bias layer, it is possible to apply longitudinal bias magnetic fields of uniform magnitude to the free magnetic layers 24 and 30.

By adjusting the magnetization directions of the free magnetic layers 24 and 30 and the pinned magnetic layers 22 and 32 in the same manner as that in the magnetic sensing element R shown in FIG. 1, the magnetic sensing element R2 can also output a pulsed signal directly when moving over a magnetization transition region of a recording medium.

The thicknesses of the pinned magnetic layers 22 and 32, the free magnetic layers 24 and 30, the nonmagnetic layers 23 and 31, and the antiferromagnetic layers 21 and 33 are adjusted in the same manner as that in the magnetic sensing element R shown in FIG. 1.

By the adjustment of the thicknesses of the individual layers and by supplying longitudinal bias magnetic fields of uniform magnitude to the free magnetic layers 24 and 30, the region below the hard magnetic layer 50 and the region above the hard magnetic layer 50 in the magnetic sensing element R2 have the same electrical resistance and the same rate of change in magnetoresistance. When a leakage magnetic field is applied in the same direction to the free magnetic layer 24 and the free magnetic layer 30, the change in the voltage between the free magnetic layer 24 and the pinned magnetic layer 22 and the change in the voltage between the free magnetic layer 30 and the pinned magnetic layer 32 cancel each other out.

That is, when the magnetic sensing element R2 does not output a pulsed signal and outputs a constant voltage, the voltage output is easily set at the zero level accurately.

Figure 5:
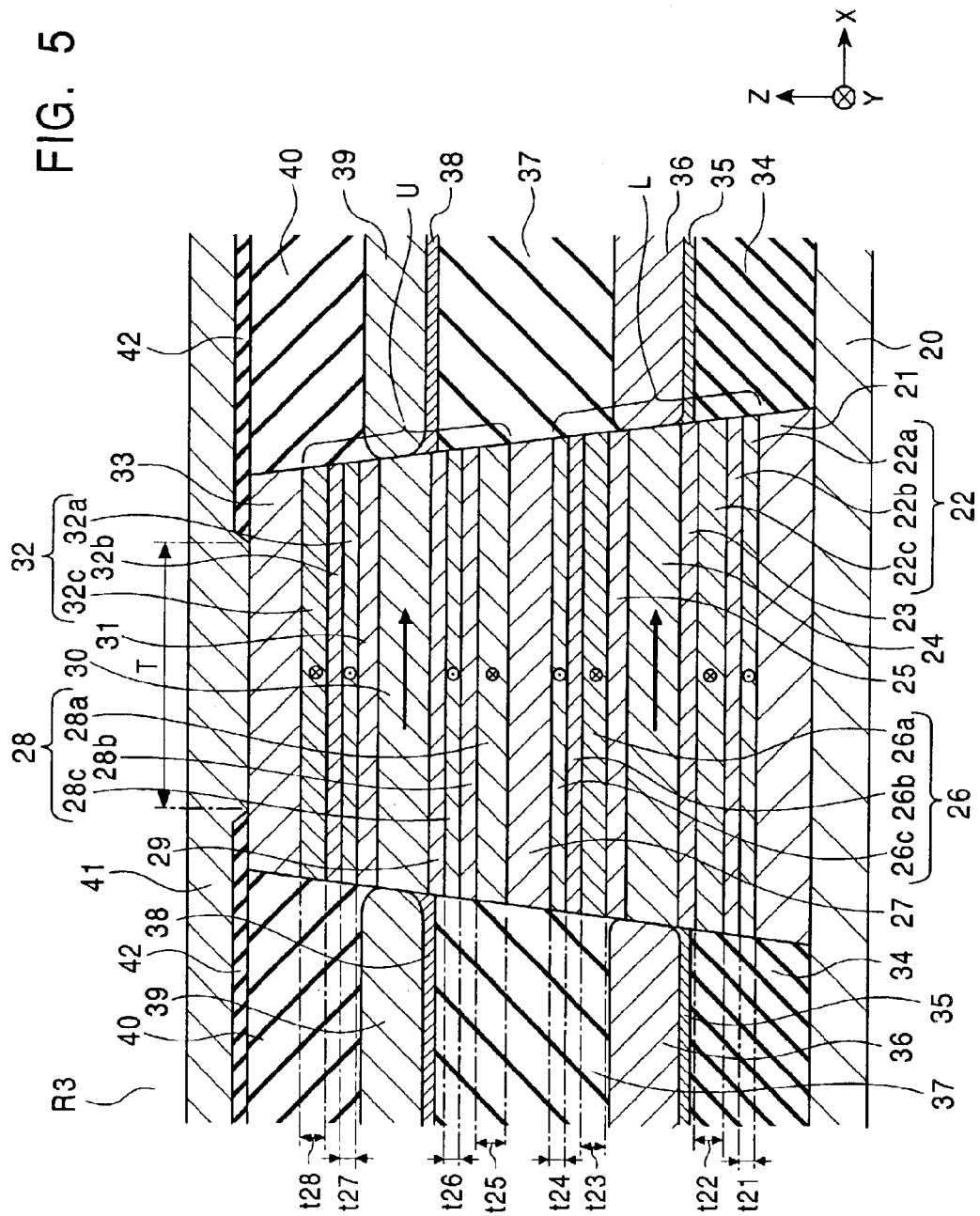
FIG. 5 is a sectional view of a magnetic sensing element in a third embodiment of the present invention.

FIG. 5 is a partial sectional view of a magnetic sensing element in a third embodiment of the present invention, viewed from a surface facing a recording medium. In FIG. 5, only the central part of the element is shown.

In a magnetic sensing element R3 shown in FIG. 5, the layer structure of the antiferromagnetic layer 21, the lower multilayer film L, the antiferromagnetic layer 27, the upper multilayer film U, and the antiferromagnetic layer 33 are the same as those of the magnetic sensing element R shown in FIG. 1. The thickness of the antiferromagnetic layers 21, 27, and 33, the thickness of the free magnetic layers 24 and 30, and the thickness of the nonmagnetic layers 23, 25, 29, and 31 are also the same as those of the magnetic sensing element R shown in FIG. 1.

The magnetic sensing element R3 shown in FIG. 5 differs from the magnetic sensing element R shown in FIG. 1 in the thicknesses of the first pinned magnetic sublayers 22a, 26c, 28a, and 32c and the second pinned magnetic sublayers 22c, 26a, 28c, and 32a constituting the pinned magnetic layers 22, 26, 28, and 32.

In the lower multilayer film L of the magnetic sensing element R3 shown in FIG. 5, the respective thicknesses t21 and t24 of the first pinned magnetic sublayers 22a and 26c are smaller than the respective thicknesses t22 and t23 of the second pinned magnetic sublayers 22c and 26a. That is, t21<t22 and t24<t23.

In the upper multilayer film U, the respective thicknesses t25 and t28 of the first pinned magnetic sublayers 28a and 32c are larger than the respective thicknesses t26 and t27 of the second pinned magnetic sublayers 28c and 32a. That is, t25>t26 and t28>t27.

In the magnetic sensing element R3 shown in FIG. 5, as in the case of the magnetic sensing element R shown in FIG. 1, in the lower multilayer film L, the magnetization direction of the first pinned magnetic sublayer 22 of the synthetic-ferrimagnetic-type pinned magnetic layer 22 is pinned antiparallel to the Y direction by an exchange coupling magnetic field with the antiferromagnetic layer 21, and the magnetization direction of second pinned magnetic sublayer 22c is pinned in the Y direction. Similarly, the magnetization direction of the first pinned magnetic sublayer 26c of the synthetic-ferrimagnetic-type pinned magnetic layer 26 is pinned antiparallel to the Y direction by an exchange coupling magnetic field with the antiferromagnetic layer 27, and the magnetization direction of the second pinned magnetic sublayer 26a is pinned in the Y direction.

In the upper multilayer film U, the magnetization direction of the first pinned magnetic sublayer 28a of the synthetic-ferrimagnetic-type pinned magnetic layer 28 is pinned in the Y direction by an exchange coupling magnetic field with the antiferromagnetic layer 27, and the magnetization direction of the second pinned magnetic sublayer 28c is pinned antiparallel to the Y direction. Similarly, the magnetization direction of the first pinned magnetic sublayer 32c of the synthetic-ferrimagnetic-type pinned magnetic layer 32 is pinned in the Y direction by an exchange coupling magnetic field with the antiferromagnetic layer 33, and the magnetization direction of the second pinned magnetic sublayer 32a is pinned antiparallel to the Y direction.

The magnetization directions of the free magnetic layer 24 and the free magnetic layer 30 are aligned substantially perpendicular to the magnetization directions of the pinned magnetic layers 22, 26, 28, and 32 by magnetic coupling with the hard bias layer 36 or 39. Preferably, the relative angle of the magnetization direction of the second pinned magnetic sublayer which directly contributes to the change in electrical resistance (output) and the magnetization direction of the free magnetic layer is orthogonal when a sensing current is applied and a signal magnetic field is not applied.

By adjusting the magnetization directions of the free magnetic layers 24 and 30 and the pinned magnetic layers 22, 26, 28, and 32 as described above, when the magnetic sensing element R3 shown in FIG. 5 moves over the magnetization transition region of a recording medium, the magnetic sensing element R3 can directly output a pulsed signal. Therefore, unlike the conventional case, signal processing can be performed without passing the output from the magnetic sensing element R3 through a differentiation circuit, and superposition of noise can be suppressed, resulting in an increase in the SIN ratio of the magnetic sensing element R3.

Moreover, in the magnetic sensing element R3, since the dual spin-valve upper multilayer film U and the dual spin-valve lower multilayer film L are stacked, an output that is more than two times larger than the output of a magnetic sensing element including only one dual spin-valve multilayer film can be obtained. In particular, in the example which will be described below, a magnetic sensing element which has an output that is five times larger than the output of a magnetic sensing element including only one dual spin-valve multilayer film is shown.

In the magnetic sensing element R3, by employing the thickness configuration for the first pinned magnetic sublayers 22a, 26c, 28a, and 32c and the second pinned magnetic sublayers 22c, 26a, 28cm and 32a as described above, when the magnetic sensing element R3 is fabricated, the magnetization directions of the first pinned magnetic sublayers 22a and 26c in the lower multilayer film L can be pinned antiparallel to the Y direction and the magnetization directions of the first pinned magnetic sublayers 28a and 32c in the upper multilayer film U can be pinned in the Y direction only by one annealing process in a magnetic field. This will be described below.

However, unlike the magnetic sensing element R shown in FIG. 1, in the magnetic sensing element R3 shown in FIG. 5, all of the first pinned magnetic sublayers 22a, 26c, 28a, and 32c do not have the same thickness, and all of the second pinned magnetic sublayers 22c, 26a, 28c, and 32c do not have the same thickness.

Therefore, the upper multilayer film U and the lower multilayer film L do not have the same electrical resistance or the same rate of change in magnetoresistance, and when a leakage magnetic field is applied in the same direction to the upper multilayer film U and the lower multilayer film L (in the state A or C in FIG. 2), it is difficult for the upper multilayer film U and the lower multilayer film L to exactly cancel out each other's voltage changes. Therefore, when a pulsed signal is not output and when a constant voltage is output, the voltage outputs Z1 and Z2 are not easily set at the zero level as shown in the output curve $O_2$ in FIG. 2.

Figure 6:
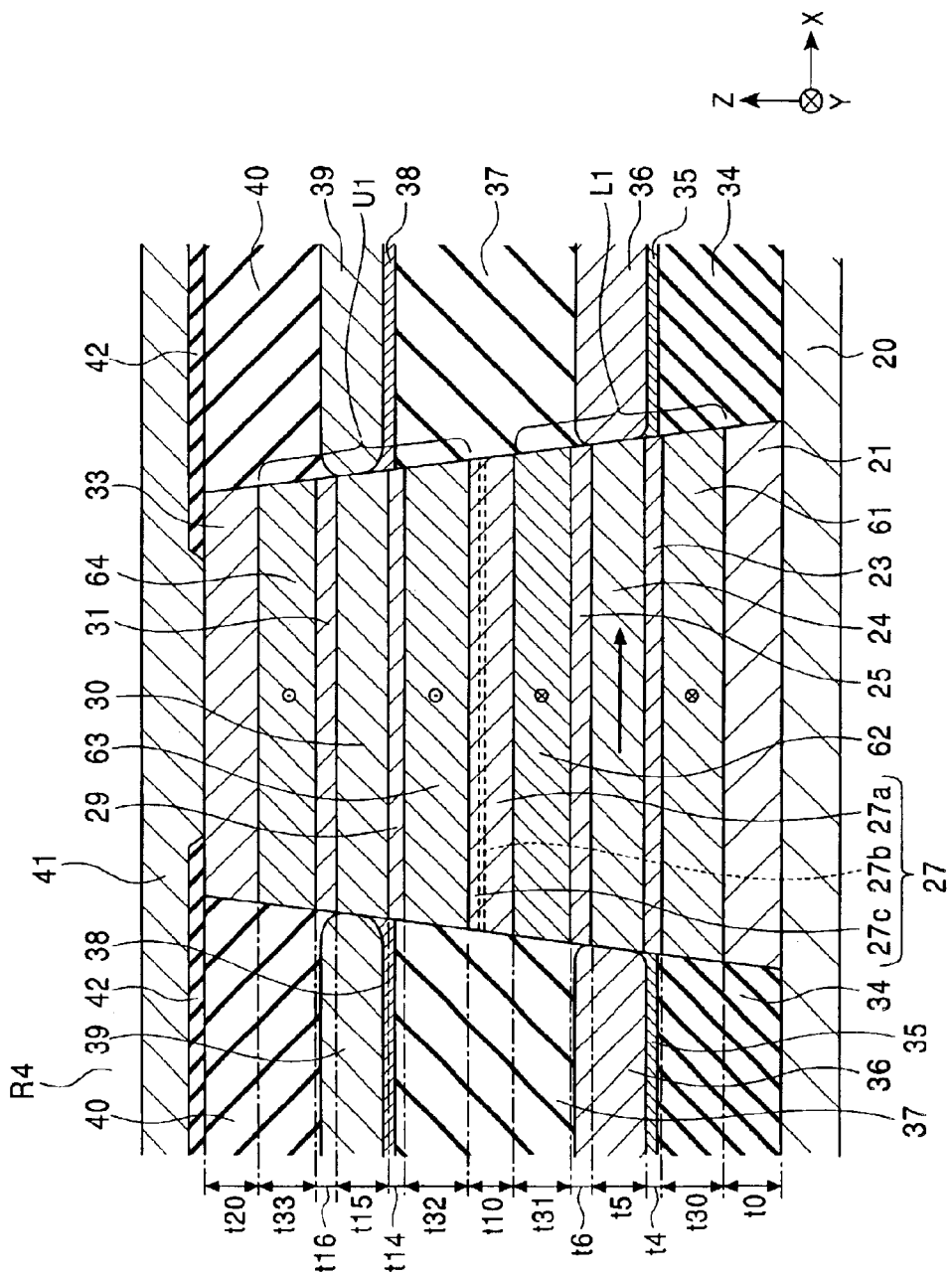
FIG. 6 is a sectional view of a magnetic sensing element in a fourth embodiment of the present invention.

FIG. 6 is a partial sectional view of a magnetic sensing element in a fourth embodiment of the present invention, viewed from a surface facing a recording medium. In FIG. 6, only the central part of the element is shown.

A magnetic sensing element R4 shown in FIG. 6 differs from the magnetic sensing element R shown in FIG. 1 in that each of pinned magnetic layers 61, 62, 63, and 64 is not a synthetic ferrimagnetic type and has a single-layer structure magnetized in one direction.

In a lower multilayer film L1, the magnetization direction of the pinned magnetic layer 61 is pinned in the Y direction (height direction, i.e., direction of leakage magnetic field from recording medium) by an exchange coupling magnetic field with the antiferromagnetic layer 21. Similarly, the magnetization direction of the pinned magnetic layer 62 is pinned in the Y direction by an exchange coupling magnetic field with the antiferromagnetic layer 27.

In an upper multilayer film U1, the magnetization direction of the pinned magnetic layer 63 is pinned antiparallel to the Y direction by an exchange coupling magnetic field with the antiferromagnetic layer 27. Similarly, the magnetization direction of the pinned magnetic layer 64 is pinned antiparallel to the Y direction by an exchange coupling magnetic field with the antiferromagnetic layer 33.

The magnetization directions of the free magnetic layer 24 and the free magnetic layer 30 are aligned substantially perpendicular to the magnetization directions of the pinned magnetic layers 61, 62, 63, and 64 by magnetic coupling with the hard bias layer 36 or 39. Preferably, the relative angle of the magnetization direction of the pinned magnetic layer and the magnetization direction of the free magnetic layer is orthogonal when a sensing current is applied and a signal magnetic field is not applied.

By adjusting the magnetization directions of the free magnetic layers 24 and 30 and the pinned magnetic layers 61, 62, 63, and 64 as described above, when the magnetic sensing element R4 shown in FIG. 6 moves over the magnetization transition region of a recording medium, the magnetic sensing element R4 can directly output a pulsed signal. Therefore, unlike the conventional case, signal processing can be performed without passing the output from the magnetic sensing element R4 through a differentiation circuit, and superposition of noise can be suppressed, resulting in an increase in the S/N ratio of the magnetic sensing element R4.

In the magnetic sensing element R4, the respective thicknesses t30, t31, t32, and t33 of the pinned magnetic layers 61, 62, 63, and 64 are equal to each other, i.e., t30=t31=t32=t33.

The thickness t5 of the free magnetic layer 24 constituting the lower multilayer film L1 is equal to the thickness t15 of the free magnetic layer 30 constituting the upper multilayer film U1, i.e., t5=t15. The respective thicknesses t4, t6, t14, and t16 of the nonmagnetic layers 23, 25, 29, and 31 are equal to each other, i.e., t4=t6=t14=t16.

The respective thicknesses t0, t10, and t20 of the three antiferromagnetic layers 21, 27, and 33 are equal to each other, i.e., t0=t10=t20.

If the thicknesses of the pinned magnetic layers 61, 62, 63, and 64, the free magnetic layers 24 and 30, the nonmagnetic layers 23, 25, 29, and 31, and the antiferromagnetic layers 21, 27, and 33 are adjusted as described above, the upper multilayer film U1 and the lower multilayer film L1 have the same electrical resistance and the same rate of change in magnetoresistance. When a leakage magnetic field is applied in the same direction to the upper multilayer film U1 and the lower multilayer film L1, the changes in the voltage in the upper multilayer film U1 and the lower multilayer film L1 cancel each other out exactly, and therefore, when a pulsed signal is not output and when a constant voltage is output, the voltage outputs Z1 and Z2 are easily set at the zero level as shown in the output curve O1 in FIG. 2.

Additionally, in the magnetic sensing element R, R3, or R4 shown in FIGS. 1, 5, or 6, longitudinal bias magnetic fields to align the free magnetic layers 24 and 30 in a single domain state may be supplied by a hard magnetic layer which functions as an in-stack bias layer provided between the upper multilayer film U or U1 and the lower multilayer film L or L1 as shown in FIG. 3. Alternatively, the insulating layer 37 between the hard bias layers 36 and 39 may be excluded to form a single hard bias layer.

In the magnetic sensing elements shown in FIGS. 1 to 6, the optical track width is determined by the distance in the track width direction of the insulating layers 42. In the magnetic sensing elements in the embodiments of the present invention, the optical track width can be set at 0.1 µm or less, in particular, 0.06 µm or less, so as to cope with a recording density of 200 Gbit/in$^2$ or more.

Figure 7:
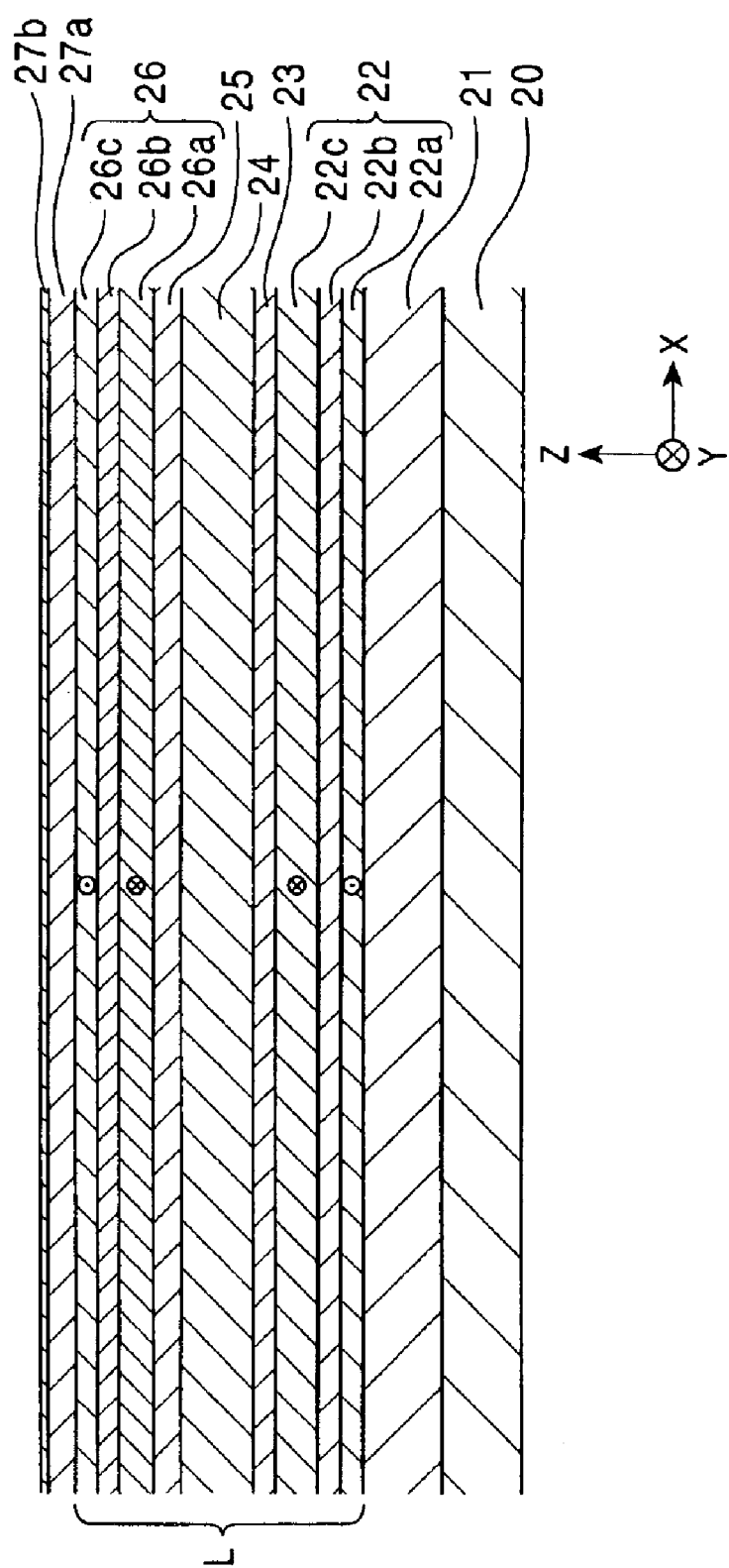
FIG. 7 is a sectional view showing a step in a fabrication process of a magnetic sensing element of the present invention.
Figure 8:
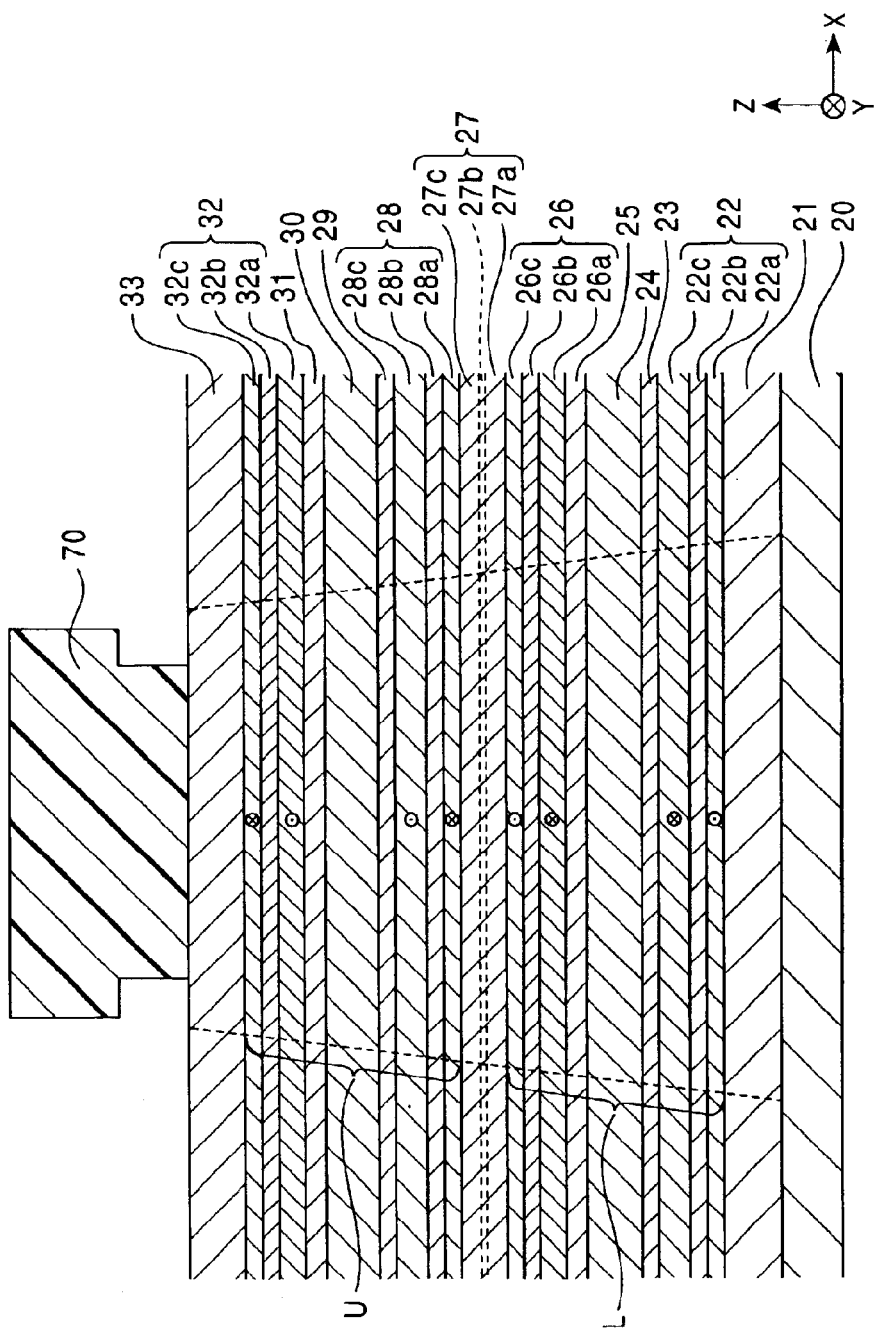
FIG. 8 is a sectional view showing a step in a fabrication process of a magnetic sensing element of the present invention.

A method for making the magnetic sensing element shown in FIG. 1 will be described below. FIGS. 7 and 8 are sectional views which show steps in a fabrication process of the magnetic sensing element R shown in FIG. 1, viewed from a surface facing a recording medium.

First, a lower shielding layer and an electrode layer 20 are formed on a substrate not shown in the drawing. The lower shielding layer may also act as the electrode layer 20.

As shown in FIG. 7, an antiferromagnetic layer 21; a lower multilayer film including a pinned magnetic layer 22 including a first pinned magnetic sublayer 22a, an intermediate nonmagnetic sublayer 22b, and a second pinned magnetic sublayer 22c, a nonmagnetic layer 23, a free magnetic layer 24, a nonmagnetic layer 25, and a pinned magnetic layer 26 including a second pinned magnetic sublayer 26a, an intermediate nonmagnetic sublayer 26b, and a first pinned magnetic sublayer 26c; a first intermediate antiferromagnetic sublayer 27a; and a nonmagnetic protective layer 27b composed of a noble metal are continuously formed in a vacuum by a sputtering process.

Sputtering may be performed using a known sputtering system, such as magnetron sputtering system, RF diode sputtering system, RF triode sputtering system, ion beam sputtering system, or face target sputtering system. In the present invention, in addition to sputtering and vapor deposition processes, a molecular beam epitaxy (MBE) process, an ionized cluster beam (ICB) process, etc., may be used.

In FIGS. 7 and 8, the layers represented by the same reference numerals as those in FIG. 1 are formed using the same materials with the same thicknesses as those in the magnetic sensing element shown in FIG. 1.

The first intermediate antiferromagnetic layer 27a is a part of an antiferromagnetic layer 27 which will be formed subsequently, and is composed of the same material as that for the antiferromagnetic layer 21.

Specifically, the first intermediate antiferromagnetic layer 27a is formed using a PtMn alloy, an X—Mn alloy, where X is at least one element selected from the group consisting of Pd, Ir, Rh, Ru, Os, Ni, and Fe, or a Pt—Mn—X' alloy, where X' is at least one element selected from the group consisting of Pd, Ir, Rh, Ru, Au, Ag, Os, Cr, Ni, Ar, Ne, Xe, and Kr.

The nonmagnetic protective layer 27b must be a dense layer which is not easily oxidized by exposure to air. In the present invention, the nonmagnetic protective layer 27b is composed of a noble metal. For example, the nonmagnetic protective layer 27b is preferably composed of at least one noble metal selected from the group consisting of Ru, Re, Pd, Os, Ir, Pt, Au, and Rh.

By sputtering a film using a noble metal, such as Ru, it is possible to obtain a dense nonmagnetic protective layer 27b which is not easily oxidized by exposure to air. Therefore, even if the thickness of the nonmagnetic protective layer 27b is decreased, the first intermediate antiferromagnetic layer 27a can be appropriately prevented from being oxidized by exposure to air.

In the present invention, the nonmagnetic protective layer 27b preferably has a thickness of 3 to 10 Å, and more preferably, 3 to 8 Å. Even by such a thin nonmagnetic protective layer 27b, the first intermediate antiferromagnetic layer 27a can be appropriately prevented from being oxidized by exposure to air.

By forming the nonmagnetic protective layer 27b with such a small thickness, ion milling for removing an oxidized portion formed by the oxidization of the nonmagnetic protective layer 27b and a non-oxidized portion partially or entirely can be performed with low energy, and milling control can be improved compared to the conventional method. Damage to the surface structure of the first intermediate antiferromagnetic layer 27a can be reduced.

After the individual layers from the electrode layer 20 to the nonmagnetic protective layer 27b are deposited on the substrate as shown in FIG. 7, annealing in a first magnetic field is performed.

The conditions for the magnitude of the first magnetic field will be described below.

First, the coercive force, spin-flop magnetic field, and saturation magnetic field of a pinned magnetic layer with a synthetic ferrimagnetic structure will be described.

Figure 11:
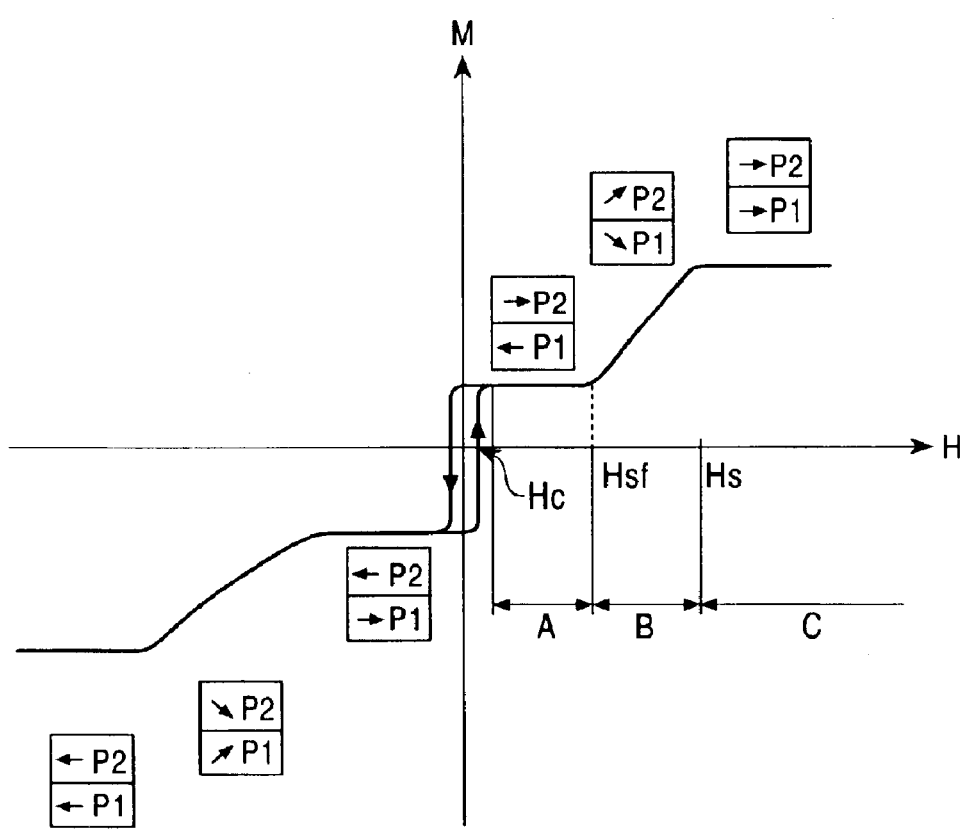
FIG. 11 is a graph which shows a relationship between an external magnetic field and the magnetization state of a laminated magnetic layer having a synthetic ferrimagnetic structure.

FIG. 11 is a conceptual diagram of a hysteresis loop for a pinned magnetic layer having a synthetic ferrimagnetic structure. For example, the magnetic moment (saturation magnetization Ms×thickness t) per unit area of a first pinned magnetic sublayer (P1) is assumed to be smaller than the magnetic moment per unit area of a second pinned magnetic sublayer (P2). An external magnetic field is assumed to be applied rightward in the drawing.

When the magnitude of the external magnetic field exceeds the coercive force Hc, the magnetizations of the first and second pinned magnetic sublayers are properly aligned into single-domain states and are antiparallel to each other, and a resultant magnetic moment per unit area determined by the vector sum of the magnetic moment per unit area of the first pinned magnetic sublayer and the magnetic moment per unit area of the second pinned magnetic sublayer (|Ms·t (P1)+Ms·t(P2)|) exceeds zero.

In an external magnetic field region A in which the resultant magnetic moment per unit area remains constant even if the magnitude of the external magnetic field is varied, since antiparallel coupling between the first pinned magnetic sublayer and the second pinned magnetic sublayer is stronger than the external magnetic field, the magnetizations of the first and second pinned magnetic sublayers are properly aligned in single-domain states, and the antiparallel state is maintained.

However, the resultant magnetic moment per unit area increases as the rightward external magnetic field is further increased. The reason for this is that since the external magnetic field is stronger than the antiparallel coupling between the first pinned magnetic sublayer and the second pinned magnetic sublayer, the magnetizations of the first pinned magnetic sublayer and the second pinned magnetic sublayer start to rotate in different directions, and thus the resultant magnetic moment per unit area determined by the vector sum is increased. In an external magnetic field region B in which the resultant magnetic moment per unit area increases, the antiparallel state of the pinned magnetic sublayers is lost. The magnitude of the external magnetic field at which the resultant magnetic moment per unit area starts to increase is referred to as a spin-flop magnetic field (Hsf).

When the rightward external magnetic field is further increased, the magnetization directions of the first pinned magnetic sublayer and the second pinned magnetic sublayer are antiparallel to each other and the magnetizations of the first pinned magnetic sublayer and the second pinned magnetic sublayer are aligned in single-domain states. Both layers are magnetized rightward this time, and the resultant magnetic moment per unit area in this external magnetic field region C remains constant. The magnitude of the external magnetic field at which the resultant magnetic moment per unit area becomes constant is referred to as a saturation magnetic field (Hs).

When the lower multilayer film L shown in FIG. 7 is annealed in a magnetic field, the direction of the applied magnetic field is antiparallel to the Y direction, and the magnitude of the applied magnetic field is larger than the saturation magnetic field (Hs) of the pinned magnetic layer 22 and the pinned magnetic layer 26. Specifically, the magnitude of the applied magnetic field is preferably 800 kA/m or more.

Therefore, when annealing is performed in the first magnetic field, the magnetization directions of the first pinned magnetic sublayer 22a and the second pinned magnetic sublayer 22c of the pinned magnetic layer 22 and the first pinned magnetic sublayer 26c and second pinned magnetic sublayer 26a of the pinned magnetic layer 26 are oriented antiparallel to the Y direction.

Alternatively, the magnitude of the magnetic field applied during annealing may be moderately weak, for example, at 8 to 24 kA/m so as to be in the region A in FIG. 11. In such a case, annealing is performed in a state in which the magnetization directions of the first pinned magnetic sublayer 22a and the second pinned magnetic sublayer 22c are antiparallel to each other and the magnetization directions of the first pinned magnetic sublayer 26c and the second pinned magnetic sublayer 26a are also antiparallel to each other. The magnetization directions of the second pinned magnetic sublayer 22c and the second pinned magnetic sublayer 26c are pinned in the direction of the annealing magnetic field, and the magnetization directions of the first pinned magnetic sublayer 22a and the first pinned magnetic sublayer 26c are pinned antiparallel to the direction of the annealing magnetic field. Consequently, if the direction of the annealing magnetic field is assumed to be the Y direction, the magnetizations of the pinned magnetic layer 22 and the pinned magnetic layer 26 are in the same states as those described above.

The annealing temperature is set to be higher than the temperature at which an exchange anisotropic magnetic field is produced between the antiferromagnetic layer 21 and the first pinned magnetic sublayer 22a and between the antiferromagnetic layer 51 and the first pinned magnetic sublayer 26c. Specifically, the annealing temperature is preferably 250 to 300° C.

Under such conditions, an exchange anisotropic magnetic field is produced each between the antiferromagnetic layer 21 and the first pinned magnetic sublayer 22a and between the first intermediate antiferromagnetic sublayer 27a and the first pinned magnetic sublayer 26c. Therefore, after annealing in the first magnetic field, the magnetization directions of the first pinned magnetic sublayer 22a and the first pinned magnetic sublayer 26c are pinned antiparallel to the Y direction.

The antiferromagnetic layer 21 and the first intermediate antiferromagnetic sublayer 27a are composed of a PtMn alloy, an X—Mn alloy, where X is at least one element selected from the group consisting of Pd, Ir, Rh, Ru, Os, Ni, and Fe, or a Pt—Mn—X' alloy, where X' is at least one element selected from the group consisting of Pd, Ir, Rh, Ru, Au, Ag, Os, Cr, Ni, Ar, Ne, Xe, and Kr. Although these alloys have a disordered face-centered cubic (fcc) structure immediately after being deposited, the structure is transformed into a CuAuI-type ordered face-centered tetragonal (fct) structure by annealing, and thus an exchange coupling magnetic field is produced at the interface with a layer composed of a ferromagnetic material.

In particular, by using PtMn alloys, it is possible to obtain an antiferromagnetic layer 21 and a first intermediate antiferromagnetic sublayer which produce exchange coupling magnetic fields of 48 kA/m or more, for example, exceeding 64 kA/m, and which have a significantly high blocking temperature of 380° C., the blocking temperature being a temperature at which the exchange coupling magnetic fields are lost.

The antiferromagnetic layer 21 and the first intermediate antiferromagnetic sublayer 27a have a thickness of 80 to 300 Å, for example, 150 Å.

The magnetization of the second pinned magnetic sublayer 22c of the pinned magnetic layer 22 is oriented antiparallel to the magnetization direction of the first pinned magnetic sublayer 22a due to the RKKY interaction, and the magnetization of the second pinned magnetic sublayer 26a of the pinned magnetic layer 26 is oriented antiparallel to the magnetization direction of the first pinned magnetic sublayer 26c.

By the annealing treatment in the first magnetic field described above, the noble metal element, such as Ru, constituting the nonmagnetic protective layer 27b is considered to be diffused into the first intermediate antiferromagnetic sublayer 27a. Therefore, the first intermediate antiferromagnetic sublayer 27a in the vicinity of the upper surface thereof is composed of the elements constituting the first intermediate antiferromagnetic sublayer 27a and the noble metal element. The content of the noble metal element diffused into the first intermediate antiferromagnetic sublayer 27a is higher at the upper surface side of the first intermediate antiferromagnetic sublayer 27a compared to the lower surface side of the first intermediate antiferromagnetic sublayer 27a, and the ratio of the diffused noble metal element is considered to gradually decrease from the upper surface of the first intermediate antiferromagnetic sublayer 27a toward the lower surface. The composition gradient described above can be determined by an apparatus for analyzing the chemical composition of a thin film, such as a secondary ion mass spectrometer (SIMS).

Next, the nonmagnetic protective layer 27b is trimmed by ion milling. The nonmagnetic protective layer 27b is left with a thickness of 1 to 3 Å or is entirely removed.

In the ion milling step, ion milling with low energy may be performed. The reason for this is that the nonmagnetic protective layer 27b has a very small thickness of approximately 3 to 10 Å.

Ion milling with low energy is defined as ion milling using a beam of ions with a beam voltage (accelerating voltage) of less than 1,000 V. For example, a beam voltage of 150 to 500 V may be used. In this embodiment, an Ar ion beam with a low beam voltage of 200 V is used.

In contrast, if a Ta film is used for the nonmagnetic protective layer 27b, since the Ta film itself is oxidized by exposure to air, in order to sufficiently protect the layer beneath the Ta film from being oxidized, the Ta film must be thick with a thickness of approximately 30 to 50 Å. Moreover, the volume of the Ta film is increased by oxidation and the thickness of the Ta film is increased to approximately 50 Å or more.

In order to remove such a thick Ta film by ion milling, the Ta film must be removed by ion milling with high energy, and it is extremely difficult to control the milling process so that only the Ta film is removed.

Therefore, the first intermediate antiferromagnetic sublayer 27a formed beneath the Ta film is also trimmed deeply, and an inert gas, such as Ar, used during ion milling may enter the first intermediate antiferromagnetic sublayer 27a from the exposed surface thereof, or the crystal structure in the surface region of the first intermediate antiferromagnetic sublayer 27a may be broken, resulting in lattice defects (the mixing effect). The magnetic properties of the first intermediate antiferromagnetic layer 27a are easily degraded by such damages. If the Ta film with a thickness of approximately 50 Å or more is trimmed by ion milling with low energy, treating time becomes excessively long, thus being impractical. Ta is easily diffused into the first intermediate antiferromagnetic sublayer 27a during the deposition process compared to the noble metal. Even if the Ta film only is removed by trimming, Ta mixes into the exposed surface of the first intermediate antiferromagnetic sublayer 27a. In the first intermediate antiferromagnetic sublayer 27a mixed with Ta, the antiferromagnetic property is degraded.

In the present invention, the nonmagnetic protective layer 27b can be trimmed by ion milling with low energy. In the ion milling process with low energy, the milling rate is low, and the margin in the stop position of milling can be narrowed. In particular, it is also possible to stop milling immediately after the nonmagnetic protective layer 27b is removed by ion milling. Therefore, the first intermediate antiferromagnetic sublayer 27a is not substantially damaged by ion milling. Additionally, the incident angle of ion milling to trim the nonmagnetic protective layer 27b is preferably set at 300 to 700 with respect to the normal to the surface of the nonmagnetic protective layer 27b. Ion milling treatment time is approximately 1 to 10 minutes.

However, if the nonmagnetic protective layer 27b is completely removed, the surface of the first intermediate antiferromagnetic layer 27a may be damaged by ion milling, resulting in a decrease in antiferromagnetism. Therefore, preferably, the nonmagnetic protective layer 27b is left at a thickness of 1 to 3 Å.

Next, after the ion milling process with low energy described above, a step shown in FIG. 8 is performed without disrupting the vacuum. In the step shown in FIG. 8, on the first intermediate antiferromagnetic sublayer 27a or on the remaining nonmagnetic protective layer 27b if the nonmagnetic protective layer 27b is not entirely removed, a second intermediate antiferromagnetic sublayer 27c is deposited in a vacuum to produce an antiferromagnetic layer 27 including the first intermediate antiferromagnetic sublayer 27a and the second intermediate antiferromagnetic sublayer 27c. On the antiferromagnetic layer 27, an upper multilayer film U including a pinned magnetic layer 28 including a first pinned magnetic sublayer 28a, an intermediate nonmagnetic sublayer 28b, and a second pinned magnetic sublayer 28c, a nonmagnetic layer 29, a free magnetic layer 30, a nonmagnetic layer 31, and a pinned magnetic layer 32 including a second pinned magnetic sublayer 32a, an intermediate nonmagnetic sublayer 32b, and a first pinned magnetic sublayer 32c; and an antiferromagnetic layer 33 are continuously formed in that order by sputtering. The sputtering and vapor deposition processes described above may be used for the formation of these layers. Additionally, a protective layer composed of Ta or the like may be formed on the top of the antiferromagnetic layer 33.

The second intermediate antiferromagnetic sublayer 27c is preferably formed using the same antiferromagnetic material used for the first intermediate antiferromagnetic sublayer 27a, and specifically, using the PtMn alloy, X—Mn alloy, or the Pt—Mn—X' alloy described above.

In FIG. 8, the first intermediate antiferromagnetic sublayer 27a, the remaining nonmagnetic protective layer 27b, and the second intermediate antiferromagnetic layer 27 constitute the antiferromagnetic layer 27. When the nonmagnetic protective layer 27b is completely removed, the first intermediate antiferromagnetic sublayer 27a and the second intermediate antiferromagnetic sublayer 27c constitute the antiferromagnetic layer 27.

The total thickness of the first intermediate antiferromagnetic sublayer 27a and the second intermediate sublayer 27c is in the range of 80 to 500 Å, for example, 150 Å.

Even when the nonmagnetic protective layer 27b remains, since the remaining nonmagnetic protective layer 27b has a small thickness of 1 to 3 Å and is composed of at least one of Ru, Re, Pd, Os, Ir, Pt, Au, and Rh, an antiferromagnetic interaction is caused between the first intermediate antiferromagnetic sublayer 27a and the second intermediate antiferromagnetic sublayer 27c, thus enabling the first intermediate antiferromagnetic sublayer 27a, the nonmagnetic protective layer 27b, and the second intermediate antiferromagnetic sublayer 27c in combination to function as the antiferromagnetic layer 27. Even if the material for the nonmagnetic protective layer 27b is diffused into the first intermediate antiferromagnetic sublayer 27a and the second intermediate antiferromagnetic sublayer 27c, antiferromagnetism is not degraded.

Next, annealing in a second magnetic field is performed in order to produce an exchange coupling magnetic field between the first pinned magnetic sublayer 28a and the antiferromagnetic layer 27 and between the first pinned magnetic sublayer 32c and the antiferromagnetic layer 33 so that the magnetization directions of the first pinned magnetic sublayer 28a and the first pinned magnetic sublayer 32c are pinned in the upper multilayer film U.

During annealing in the second magnetic field, the direction of the second magnetic field is antiparallel to the Y direction, and the magnitude of the second magnetic field is larger than the coercive force (Hc) and is smaller than the spin-flop magnetic field (Hsf) of each of the pinned magnetic layer 28 and the pinned magnetic layer 32. Specifically, the magnitude of the second magnetic field is 8 to 24 kA/m.

During annealing in the second magnetic field, in order to prevent the change in the magnetization directions of the pinned magnetic layers 22 and 26 in the lower multilayer film L, the magnitude of the applied magnetic field must be smaller than the magnitude of the exchange anisotropic magnetic field produced each between the antiferromagnetic layer 21 and the first pinned magnetic sublayer 22a and between the first intermediate antiferromagnetic sublayer 27a and the first pinned magnetic sublayer 26c.

The annealing temperature is set to be higher than the temperature at which an exchange anisotropic magnetic field is produced each between the antiferromagnetic layer 33 and the first pinned magnetic sublayer 32c and between the second intermediate antiferromagnetic sublayer 27c and the first pinned magnetic sublayer 28a. Specifically, the annealing temperature is preferably 250 to 300° C.

The annealing temperature in the second magnetic field must be lower than the blocking temperature at which the exchange coupling magnetic field is lost at the interface between each of the antiferromagnetic layer 21 and the antiferromagnetic layer 27 and the first pinned magnetic sublayer in contact therewith.

During annealing in the second magnetic field, the magnetization direction of the second pinned magnetic sublayer 28c having a larger magnetic moment per unit area than that of the first pinned magnetic sublayer 28a and the magnetization direction of the second pinned magnetic sublayer 32a having a larger magnetic moment per unit area than that of the first pinned magnetic sublayer 32c are oriented antiparallel to the Y direction.

The magnetization direction of the first pinned magnetic sublayer 28a of the pinned magnetic layer 28 is oriented antiparallel to the magnetization direction of the second pinned magnetic sublayer 28c by the RKKY interaction, and the magnetization direction of the first pinned magnetic sublayer 32c of the pinned magnetic layer 32 is oriented antiparallel to the magnetization direction of the second pinned magnetic sublayer 32a by the RKKY interaction.

Under such conditions, an exchange anisotropic magnetic field is produced each between the antiferromagnetic layer 27 and the first pinned magnetic sublayer 28a and between the antiferromagnetic layer 33 and the first pinned magnetic sublayer 32c. Therefore, after annealing in the second magnetic field, the magnetization directions of the first pinned magnetic sublayer 28a and the first pinned magnetic sublayer 32c are pinned in the Y direction.

As in the case of this embodiment, if a fabrication method is employed in which after a lower multilayer film L is formed and annealed in a first magnetic field, an upper multilayer film U is formed and annealed in a second magnetic field, the antiferromagnetic layer 21, the antiferromagnetic layer 27, and the antiferromagnetic layer 33 can be formed using the same antiferromagnetic material.

Next, as shown in FIG. 8, a resist layer 70 is formed on the antiferromagnetic layer 33 or on a protective layer (not shown in the drawing) formed on the antiferromagnetic layer 33, and the resist layer 70 with a shape shown in FIG. 8 is left by exposure and development. For example, the resist layer 70 is provided with an undercut region for a lift-off process.

The side regions not covered with the resist layer 70 are then trimmed by ion milling along the chain lines shown in FIG. 8.

After the ion milling step is completed, insulating layers 34 composed of $Al_2O_3$, $SiO_2$, or the like, bias underlayers 35, hard bias layers 36, insulating layers 37, bias underlayers 38, hard bias layers 39, and insulating layers 40 are formed in the state in which the resist-layer 70 remains. The hard bias layers 36 are formed so as to face the end faces of the free magnetic layer 24, and the hard bias layers 39 are formed so as to face the end faces of the free magnetic layer 30.

The resist layer 70 is removed by the lift-off process using an organic solvent or the like. Furthermore, insulating layers 42 are formed by patterning over the insulating layers 40 and both end regions in the track width direction (in the X direction) of the antiferromagnetic layer 33 with a predetermined distance T therebetween.

A second electrode layer 41 is then formed over the insulating layers 42 and the antiferromagnetic layer 33, and an upper shielding layer (not shown in the drawing) composed of a soft magnetic material, such as NiFe, is formed in contact with the upper surface of the electrode layer 41. Since the soft magnetic material, such as NiFe, is electrically conductive, the upper shielding layer may be formed directly on the upper surface of the antiferromagnetic layer 33 so as to act as an electrode layer.

As a result, as shown in FIG. 1, a magnetic sensing element R is obtained, in which the magnetization directions of the second pinned magnetic sublayer 22c of the pinned magnetic layer 22 and the second pinned magnetic sublayer 26a of the pinned magnetic layer 26 are oriented in the Y direction, and the magnetization directions of the second pinned magnetic sublayer 28c of the pinned magnetic layer 28 and the second pinned magnetic sublayer 32a of the pinned magnetic layer 32 are pinned antiparallel to the Y direction.

The magnetization directions of the free magnetic layers 24 and 30 are aligned substantially perpendicular to the magnetization directions of the pinned magnetic layers 22, 26, 28, and 32. Preferably, the relative angle between the magnetization direction of the second pinned magnetic sublayer which directly contributes to the change in electrical resistance (output) and the magnetization direction of the free magnetic layer is orthogonal when a sensing current is applied and a signal magnetic field is not applied.

By adjusting the magnetization directions of the free magnetic layers 24 and 30 and the pinned magnetic layers 22, 26, 28, and 32 as described above, the magnetic sensing element R shown in FIG. 1 can output a pulsed signal directly when moving over a magnetization transition region.

Therefore, unlike the conventional case, signal processing can be performed without passing the output from the magnetic sensing element R through a differentiation circuit, and superposition of noise can be suppressed, resulting in an increase in the S/N ratio of the magnetic sensing element R.

Moreover, in the magnetic sensing element R, since the dual spin-valve upper multilayer film U and the dual spin-valve lower multilayer film L are stacked, an output that is more than two times larger than the output of a magnetic sensing element including only one dual spin-valve multilayer film can be obtained. In particular, in the example which will be described below, a magnetic sensing element which has an output that is five times larger than the output of a magnetic sensing element including only one dual spin-valve multilayer film is shown.

Additionally, as shown in FIG. 1, in the magnetic sensing element R thus formed, the respective thicknesses t1, t8, t11, and t18 of the first pinned magnetic sublayers 22a, 26c, 28a, and 32c are equal to each other, i.e., t1=t8=t11=t18. The respective thicknesses t2, t7, t12, and t17 of the second pinned magnetic sublayers 22c, 26a, 28c, and 32a are equal to each other, i.e., t2=t7=t12=t17. The respective thicknesses t3, t9, t13, and t19 of the intermediate nonmagnetic sublayers 22b, 26b, 28b, and 32c are equal to each other, i.e., t3=t9=t13=t19.

Therefore, all of the four pinned magnetic layers 22, 26, 28, and 32 have the same thickness.

Furthermore, the thickness t5 of the free magnetic layer 24 constituting the lower multilayer film L is equal to the thickness t15 of the free magnetic layer 30 constituting the upper multilayer film U, i.e., t5=t15. The respective thicknesses t4, t6, t14, and t16 of the nonmagnetic layers 23, 25, 29, and 31 are equal to each other, i.e., t4=t6=t14=t16.

The thicknesses of these layers can be adjusted when the individual layers are formed.

The respective thicknesses t0, t10, and t20 of the three antiferromagnetic layers 21, 27, and 33 are equal to each other, i.e., t0=t10=t20.

If the thicknesses of the pinned magnetic layers 22, 26, 28, and 32, the free magnetic layers 24 and 30, the nonmagnetic layers 23, 25, 29, and 31, and the antiferromagnetic layers 21, 27, and 33 are adjusted as described above, the upper multilayer film U and the lower multilayer film L have the same electrical resistance and the same rate of change in magnetoresistance. When a leakage magnetic field is applied in the same direction to the upper multilayer film U and the lower multilayer film L (in the state A or C in FIG. 2), the changes in the voltage in the upper multilayer film U and the lower multilayer film L cancel each other out, and therefore, when a pulsed signal is not output and when a constant voltage is output, the voltage outputs Z1 and Z2 are easily set to the zero level exactly as shown in the output curve O1 in FIG. 2.

The line recording resolution of the magnetic sensing element R shown in FIG. 1 depends on the distance between the free magnetic layer 24 and the free magnetic layer 30. The magnetic sensing element R shown in FIG. 1 is formed so that the distance between the free magnetic layer 24 and the free magnetic layer 30 is 200 to 300 Å.

Figure 9:
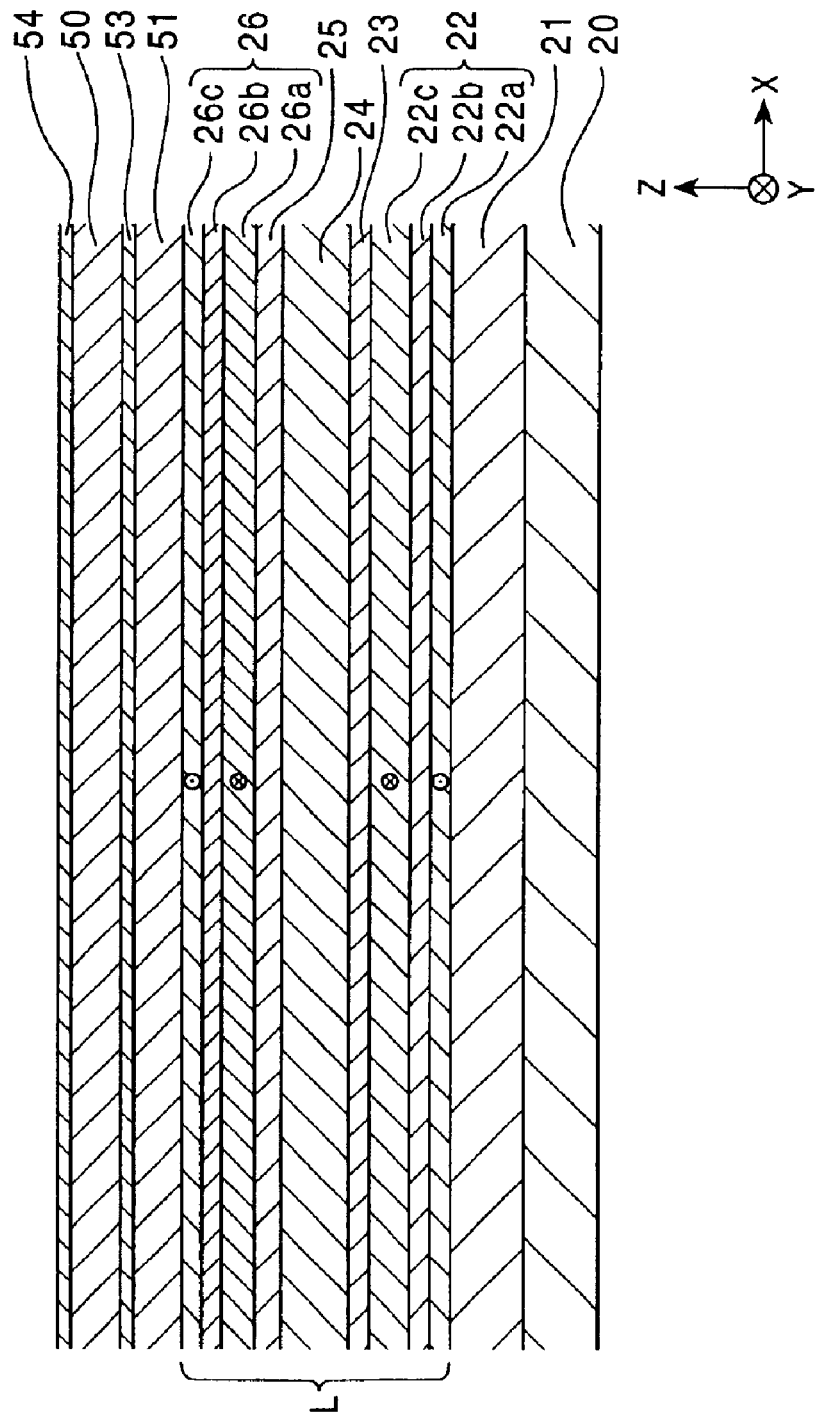
FIG. 9 is a sectional view showing a step in a fabrication process of a magnetic sensing element of the present invention.
Figure 10:
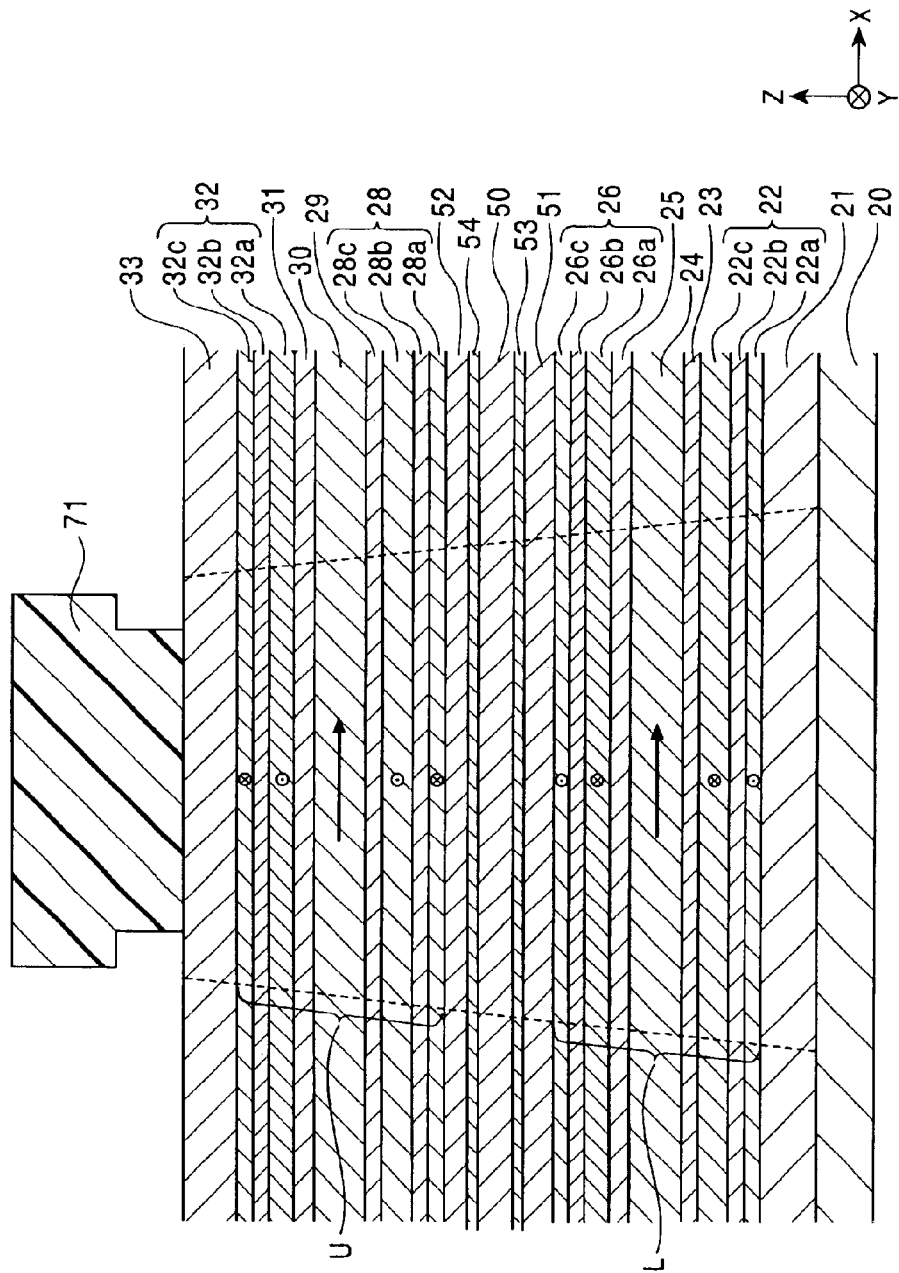
FIG. 10 is a sectional view showing a step in a fabrication process of a magnetic sensing element of the present invention.

A method for making the magnetic sensing element R1 shown in FIG. 3 will be described below. FIGS. 9 and 10 are sectional view which show steps in a fabrication process of the magnetic sensing element R1 shown in FIG. 3, viewed from a surface facing a recording medium.

First, a lower shielding layer (not shown in the drawing) and an electrode layer 20 are formed on a substrate (not shown in the drawing). The lower shielding layer may also act as the electrode layer 20.

As shown in FIG. 9, an antiferromagnetic layer 21; a lower multilayer film including a pinned magnetic layer 22 including a first pinned magnetic sublayer 22a, an intermediate nonmagnetic sublayer 22b, and a second pinned magnetic sublayer 22c, a nonmagnetic layer 23, a free magnetic layer 24, a nonmagnetic layer 25, and a pinned magnetic layer 26 including a second pinned magnetic sublayer 26a, an intermediate nonmagnetic sublayer 26b, and a first pinned magnetic sublayer 26c; an antiferromagnetic layer 51; a separating layer 53, a hard magnetic layer 50, and a separating layer 54 are continuously formed in a vacuum by a sputtering process.

Sputtering may be performed using a known sputtering system, such as magnetron sputtering system, RF diode sputtering system, RF triode sputtering system, ion beam sputtering system, or face target sputtering system. In the present invention, in addition to sputtering and vapor deposition processes, a molecular beam epitaxy (MBE) process, an ionized cluster beam (ICB) process, etc., may be used.

In FIGS. 9 and 10, the layers represented by the same reference numerals as those in FIG. 3 are formed using the same materials with the same thicknesses as those in the magnetic sensing element shown in FIG. 3.

The antiferromagnetic layer 51 and the antiferromagnetic layer 21 are composed of the same material.

Specifically, the antiferromagnetic layer 51 is formed using a PtMn alloy, an X—Mn alloy, where X is at least one element selected from the group consisting of Pd, Ir, Rh, Ru, Os, Ni, and Fe, or a Pt—Mn—X' alloy, where X' is at least one element selected from the group consisting of Pd, Ir, Rh, Ru, Au, Ag, Os, Cr, Ni, Ar, Ne, Xe, and Kr.

The hard magnetic layer 50 is composed of a hard magnetic material, such as CoPt, and functions as a so-called in-stack bias layer.

The separating layers 53 and 54 prevent an exchange coupling magnetic field from being produced each between the antiferromagnetic layer 51 and the hard magnetic layer 50 and between an antiferromagnetic layer 52 formed in the step shown in FIG. 10 and the hard magnetic layer 50. The separating layers 53 and 54 are composed of nonmagnetic conductive materials. In particular, the separating layer 54 is preferably formed using a NiFe alloy, a Ni—Fe—Y alloy, or Cr, where Y is at least one element selected from the group consisting of Cr, Rh, Ta, Hf, Nb, Zr, and Ti, so that the separating layer 54 may function as a seed layer for the antiferromagnetic layer 52. In the step shown in FIG. 9, the separating layer 53 is formed using the same material as that for the separating layer 54. Preferably, the separating layer 53 is formed using a metal, such as Cr or W, having a {100}-oriented body-centered cubic (bcc) structure in order to improve the coercive force and remanence ratio of the hard magnetic layer 50.

After the individual layers from the electrode layer 20 to the separating layer 54 are deposited on the substrate as shown in FIG. 9, annealing in a first magnetic field is performed.

The conditions for the magnitude of the first magnetic field applied during annealing will be described below.

When annealing is performed in the first magnetic field, a magnetic field oriented antiparallel to the Y direction with a magnitude larger than the saturation magnetic field (Hs) of each of the pinned magnetic layer and the pinned magnetic layer 26 is applied. Specifically, the magnitude of the applied magnetic field is preferably 800 kA/m or more.

Therefore, when annealing is performed in the first magnetic field, the magnetization directions of the first pinned magnetic sublayer 22*a* and the second pinned magnetic sublayer 22*c* of the pinned magnetic layer 22 and the first pinned magnetic sublayer 26*c* and the second pinned magnetic sublayer 26*a* of the pinned magnetic layer 26 are oriented antiparallel to the Y direction.

Alternatively, the magnitude of the magnetic field applied during annealing may be moderately weak, for example, at 8 to 24 kA/m so as to be in the region A in FIG. 11. In such a case, annealing is performed in a state in which the magnetization directions of the first pinned magnetic sublayer 22*a* and the second pinned magnetic sublayer 22*c* are antiparallel to each other and the magnetization directions of the first pinned magnetic sublayer 26*c* and the second pinned magnetic sublayer 26*a* are also antiparallel to each other. The magnetization directions of the second pinned magnetic sublayer 22*c* and the second pinned magnetic sublayer 26*c* are pinned in the direction of the annealing magnetic field, and the magnetization directions of the first pinned magnetic sublayer 22*a* and the first pinned magnetic sublayer 26*c* are pinned antiparallel to the direction of the annealing magnetic field. Consequently, if the direction of the annealing magnetic field is assumed to be the Y direction, the magnetizations of the pinned magnetic layer 22 and the pinned magnetic layer 26 are in the same states as those described above.

The annealing temperature is set to be higher than the temperature at which an exchange anisotropic magnetic field is produced between the antiferromagnetic layer 21 and the first pinned magnetic sublayer 22*a* and between the antiferromagnetic sublayer 51 and the first pinned magnetic sublayer 26*c*. Specifically, the annealing temperature is preferably 250 to 300° C.

Consequently, during annealing in the first magnetic field, the magnetization directions of the first pinned magnetic sublayer 22*a* and the second pinned magnetic sublayer 22*c* of the pinned magnetic layer 22 and the first pinned magnetic sublayer 26*c* and the second pinned magnetic sublayer 26*a* of the pinned magnetic layer 26 are oriented antiparallel to the Y direction.

Under such conditions, an exchange anisotropic magnetic field is produced each between the antiferromagnetic layer and the first pinned magnetic sublayer 27*a* and between the antiferromagnetic layer 51 and the first pinned magnetic sublayer 26*c*. Therefore, after annealing in the first magnetic field, the magnetization directions of the first pinned magnetic sublayer 22*a* and the first pinned magnetic sublayer 26*c* are pinned antiparallel to the Y direction.

The antiferromagnetic layer 21 and the antiferromagnetic layer 51 have a thickness of 80 to 300 Å, for example, 150 Å.

The magnetization of the second pinned magnetic sublayer 22*c* of the pinned magnetic layer 22 is oriented antiparallel to the magnetization direction of the first pinned magnetic sublayer 22*a* due to the RKKY interaction, and the magnetization of the second pinned magnetic sublayer 26*a* of the pinned magnetic layer 26 is oriented antiparallel to the magnetization direction of the first pinned magnetic sublayer 26*c*.

Next, the surface of the separating layer 54 is trimmed by ion milling to remove the oxide film on the surface.

In the step shown in FIG. 10, the thickness of the remaining separating layer 54 is increased by using the same material as that used in the step 9. Furthermore, an antiferromagnetic layer 52; an upper multilayer film U including a pinned magnetic layer 28 including a first pinned magnetic sublayer 28*a*, an intermediate nonmagnetic sublayer 28*b*, and a second pinned magnetic sublayer 28*c*, a nonmagnetic layer 29, a free magnetic layer 30, a nonmagnetic layer 31, and a pinned magnetic layer 32 including a second pinned magnetic sublayer 32*a*, an intermediate nonmagnetic sublayer 32*b*, and a first pinned magnetic sublayer 32*c*; and an antiferromagnetic layer 33 are continuously deposited by sputtering in a vacuum. The sputtering and vapor deposition processes described above may be used for the formation of these layers. Additionally, a protective layer composed of Ta or the like may be formed on the top of the antiferromagnetic layer 33.

The antiferromagnetic layer 52 is preferably composed of the same antiferromagnetic material as that for the antiferromagnetic layer 51, and specifically, composed of the PtMn alloy, the X—Mn alloy, or the Pt—Mn—X' alloy.

The thickness of the antiferromagnetic layer 52 is 80 to 500 Å for example, 150 Å.

Next, annealing in a second magnetic field is performed in order to produce an exchange coupling magnetic field between the first pinned magnetic sublayer 28*a* and the antiferromagnetic layer 52 and between the first pinned magnetic sublayer 32*c* and the antiferromagnetic layer 33 so that the magnetization directions of the first pinned magnetic sublayer 28*a* and the first pinned magnetic sublayer 32*c* are pinned in the upper multilayer film U.

During annealing in the second magnetic field, the direction of the second magnetic field is antiparallel to the Y direction, and the magnitude of the second magnetic field is larger than the coercive force (Hc) and is smaller than the spin-flop magnetic field (Hsf) of each of the pinned magnetic layer 28 and the pinned magnetic layer 32. Specifically, the magnitude of the second magnetic field is preferably 8 to 24 kA/m.

During annealing in the second magnetic field, in order to prevent the change in the magnetization directions of the pinned magnetic layers 22 and 26 in the lower multilayer film L, the magnitude of the applied magnetic field must be smaller than the magnitude of the exchange anisotropic magnetic field produced each between the antiferromagnetic layer 21 and the first pinned magnetic sublayer 22*a* and between the antiferromagnetic layer 51 and the first pinned magnetic sublayer 26*c*.

The annealing temperature is set to be higher than the temperature at which an exchange anisotropic magnetic field is produced each between the antiferromagnetic layer 52 and the first pinned magnetic sublayer 28*a* and between the antiferromagnetic layer 33 and the first pinned magnetic sublayer 32*c*. Specifically, the annealing temperature is preferably 250 to 300° C.

The annealing temperature in the second magnetic field must be lower than the blocking temperature at which the exchange coupling magnetic field is lost at the interface between each of the antiferromagnetic layer 21 and the antiferromagnetic layer 51 and the first pinned magnetic sublayer in contact therewith.

During annealing in the second magnetic field, the magnetization direction of the second pinned magnetic sublayer 28*c* having a larger magnetic moment per unit area than that of the first pinned magnetic sublayer 28a and the magnetization direction of the second pinned magnetic sublayer 32a having a larger magnetic moment per unit area than that of the first pinned magnetic sublayer 32c are oriented antiparallel to the Y direction.

The magnetization direction of the first pinned magnetic sublayer 28a of the pinned magnetic layer 28 is oriented antiparallel to the magnetization direction of the second pinned magnetic sublayer 28c by the RKKY interaction, and the magnetization direction of the first pinned magnetic sublayer 32c of the pinned magnetic layer 32 is oriented antiparallel to the magnetization direction of the second pinned magnetic sublayer 32a by the RKKY interaction.

Under such conditions, an exchange anisotropic magnetic field is produced each between the antiferromagnetic layer 52 and the first pinned magnetic sublayer 28a and between the antiferromagnetic layer 33 and the first pinned magnetic sublayer 32c. Therefore, after annealing in the second magnetic field, the magnetization directions of the first pinned magnetic sublayer 28a and the first pinned magnetic sublayer 32c are pinned in the Y direction.

As in the case of this embodiment, if a fabrication method is employed in which after a lower multilayer film L is formed and annealed in a first magnetic field, an upper multilayer film U is formed and annealed in a second magnetic field, the antiferromagnetic layer 21, the antiferromagnetic layer 51, the antiferromagnetic layer 52, and the antiferromagnetic layer 33 can be formed using the same antiferromagnetic material.

In the step shown in FIG. 9, annealing in the first magnetic field is performed after the hard magnetic layer 50 is deposited. However, a method may be used, in which annealing in the first magnetic field is performed after the separating layer 53 is partially formed, the rest of the separating layer 53 is added thereto without performing ion milling, and the hard magnetic layer 50 and the separating layer 54 are deposited, and then the step shown in FIG. 10 is performed.

If the hard magnetic layer 50 is deposited after the first annealing process, the c-axis of the hard magnetic layer 50 is prevented from being oriented perpendicular to the plane under the influence of the {111}-orientation of the multilayer film L, resulting in reduction in the coercive force and remanence ratio.

Next, as shown in FIG. 10, a resist layer 71 is formed on the antiferromagnetic layer 33 or on a protective layer (not shown in the drawing) formed on the antiferromagnetic layer 33, and the resist layer 71 with a shape shown in FIG. 10 is left by exposure and development. For example, the resist layer 71 is provided with an undercut region for a lift-off process.

The side regions not covered with the resist layer 71 are then trimmed by ion milling along the chained lines shown in FIG. 10.

After the ion milling step is completed, insulating layers 55 composed of $Al_2O_3$, $SiO_2$, or the like are formed.

The resist layer 71 is removed by the lift-off process using an organic solvent or the like. Furthermore, insulating layers 42 are formed by patterning over the insulating layers 55 and both end regions in the track width direction (in the X direction) of the antiferromagnetic layer 33 with a predetermined distance T therebetween.

A second electrode layer 41 is then formed over the insulating layers 42 and the antiferromagnetic layer 33, and an upper shielding layer (not shown in the drawing) composed of a soft magnetic material, such as NiFe, is formed in contact with the upper surface of the electrode layer 41. Since the soft magnetic material, such as NiFe, is electrically conductive, the upper shielding layer may be formed directly on the upper surface of the antiferromagnetic layer 33 so as to act as an electrode layer.

As a result, as shown in FIG. 3, a magnetic sensing element R1 is obtained, in which the magnetization directions of the second pinned magnetic sublayer 22c of the pinned magnetic layer 22 and the second pinned magnetic sublayer 26a of the pinned magnetic layer 26 are oriented in the Y direction, and the magnetization directions of the second pinned magnetic sublayer 28c of the pinned magnetic layer 28 and the second pinned magnetic sublayer 32a of the pinned magnetic layer 32 are pinned antiparallel to the Y direction.

The magnetization directions of the free magnetic layers 24 and 30 are aligned substantially perpendicular to the magnetization directions of the pinned magnetic layers 22, 26, 28, and 32 by magnetostatic coupling with the hard magnetic layer 50 which functions as an in-stack bias layer. Preferably, the relative angle between the magnetization direction of the second pinned magnetic sublayer which directly contributes to the change in electrical resistance (output) and the magnetization direction of the free magnetic layer is orthogonal when a sensing current is applied and a signal magnetic field is not applied.

By adjusting the magnetization directions of the free magnetic layers 24 and 30 and the pinned magnetic layers 22, 26, 28, and 32 as described above, the magnetic sensing element R1 can output a pulsed signal directly when moving over the magnetization transition region of a recording medium.

Therefore, unlike the conventional case, signal processing can be performed without passing the output from the magnetic sensing element through a differentiation circuit, and superposition of noise can be suppressed, resulting in an increase in the S/N ratio of the magnetic sensing element R1.

Moreover, in the magnetic sensing element R1, since the dual spin-valve upper multilayer film U and the dual spin-valve lower multilayer film L are stacked, an output that is more than two times larger than the output of a magnetic sensing element including only one dual spin-valve multilayer film can be obtained. In particular, in the example which will be described below, a magnetic sensing element which has an output that is five times larger than the output of a magnetic sensing element including only one dual spin-valve multilayer film is shown.

The thicknesses of the pinned magnetic layers 22, 26, 28, and 32, the free magnetic layers 24 and 30, the nonmagnetic layers 23, 25, 29, and 31, and the antiferromagnetic layers 21 and 33 are adjusted in the same manner as that for the magnetic sensing element R shown in FIG. 1. Furthermore, the antiferromagnetic layer 51 and the antiferromagnetic layer 52 have the same thickness, and the separating layer 53 and the separating layer 54 have the same thickness.

By adjusting the thicknesses of the individual layers and by applying longitudinal bias magnetic fields of uniform magnitude to the free magnetic layers 24 and 30, the upper multilayer film U and the lower multilayer film L also have the same electrical resistance and the same rate of change in magnetoresistance in the magnetic sensing element R1. When a leakage magnetic field is applied in the same direction to the upper multilayer film U and the lower multilayer film L (in the state A or C in FIG. 2), the changes in the voltage in the upper multilayer film U and the lower multilayer film L cancel each other out exactly.

Therefore, when a pulsed signal is not output by the magnetic sensing element RI and a constant voltage is output, the voltage output is easily set at the zero level exactly.

The line recording resolution of the magnetic sensing element R1 shown in FIG. 3 depends on the distance between the free magnetic layer 24 and the free magnetic layer 30. The magnetic sensing element R1 shown in FIG. 3 is formed so that the distance between the free magnetic layer 24 and the free magnetic layer 30 is 200 to 500 Å.

A method for making the magnetic sensing element R3 shown in FIG. 5 will be described below.

First, a lower shielding layer (not shown in the drawing) and an electrode layer 20 are formed on a substrate (not shown in the drawing). The lower shielding layer may also act as the electrode layer 20.

Furthermore, an antiferromagnetic layer 21; a lower multilayer film L including a pinned magnetic layer 22 including a first pinned magnetic sublayer 22a, an intermediate nonmagnetic sublayer 22b, and a second pinned magnetic sublayer 22c, a nonmagnetic layer 23, a free magnetic layer 24, a nonmagnetic layer 25, and a pinned magnetic layer 26 including a second pinned magnetic sublayer 26a, an intermediate nonmagnetic sublayer 26b, and a first pinned magnetic sublayer 26c; an antiferromagnetic layer 27; an upper multilayer film U including a pinned magnetic layer 28 including a first pinned magnetic sublayer 28a, an intermediate nonmagnetic sublayer 28b, and a second pinned magnetic sublayer 28c, a nonmagnetic layer 29, a free magnetic layer 30, a nonmagnetic layer 31, and a pinned magnetic layer 32 including a second pinned magnetic sublayer 32a, an intermediate nonmagnetic sublayer 32b, and a first pinned magnetic sublayer 32c; and an antiferromagnetic layer 33 are continuously formed in that order from the bottom in a vacuum by a sputtering process. Additionally, a protective layer composed of Ta or the like may be formed on the top of the antiferromagnetic layer 33.

Sputtering may be performed using a known sputtering system, such as magnetron sputtering system, RF diode sputtering system, RF triode sputtering system, ion beam sputtering system, or face target sputtering system. In the present invention, in addition to sputtering and vapor deposition processes, a molecular beam epitaxy (MBE) process, an ionized cluster beam (ICB) process, etc., may be used.

When the layers from the antiferromagnetic layer 21 to the antiferromagnetic layer 33 are continuously deposited, the lower multilayer film L is formed so that the respective thicknesses t21 and t24 of the first pinned magnetic sublayers 22a and 26c are smaller than the respective thicknesses t22 and t23 of the second pinned magnetic sublayers 22c and 26a. That is, t21<t22 and t24<t23.

The upper multilayer film U is formed so that the respective thicknesses t25 and t28 of the first pinned magnetic sublayers 28a and 32c are larger than the respective thicknesses t26 and t27 of the second pinned magnetic sublayers 28c and 32a. That is, t25>t26 and t28>t27.

The first pinned magnetic sublayers 22a and 26c, the second pinned magnetic sublayers 22c and 26a, the first pinned magnetic sublayer 28a and 32c, and the second pinned magnetic sublayer 28c and 32a are composed of the same magnetic material.

Next, the laminate including the antiferromagnetic layer 21, the lower multilayer film L, the antiferromagnetic layer 27, the upper multilayer film U, and the antiferromagnetic layer 33 are annealed in a magnetic field oriented in the Y direction, the magnetic field being larger than the coercive force and smaller than the spin-flop magnetic field of each of the pinned magnetic layers 22, 26, 28, and 32. Specifically, the magnitude of the annealing magnetic field is preferably 8 to 24 kA/m.

The annealing temperature is set to be higher than the temperature at which an exchange anisotropic magnetic field is produced each between the antiferromagnetic layer 21 and the first pinned magnetic sublayer 22a, between the antiferromagnetic layer 27 and the first pinned magnetic sublayer 26c, between the antiferromagnetic layer 27 and the first pinned magnetic sublayer 28a, and between the antiferromagnetic layer 33 and the first pinned magnetic sublayer 32c. Specifically, the annealing temperature is preferably 250 to 300° C.

When annealing is performed in the magnetic field that is larger than the coercive force and smaller than the spin-flop magnetic field of each of the pinned magnetic layers 22, 26, 28, and 32, the magnetization direction of the second pinned magnetic sublayer 22c having a larger magnetic moment per unit area than that of the first pinned magnetic sublayer 22a and the magnetization direction of the second pinned magnetic sublayer 26a having a larger magnetic moment per unit area than that of the first pinned magnetic sublayer 26c are oriented in the Y direction. The magnetization direction of the first pinned magnetic sublayer 28a having a larger magnetic moment per unit area than that of the second pinned magnetic sublayer 28c and the magnetization direction of the first pinned magnetic sublayer 32c having a larger magnetic moment per unit area than that of the second pinned magnetic sublayer 32a are oriented in the Y direction.

The magnetization direction of the first pinned magnetic sublayer 22a is oriented antiparallel to the magnetization direction of the second pinned magnetic sublayer 22c by the RKKY interaction, and the magnetization direction of the first pinned magnetic sublayer 26c is oriented antiparallel to the magnetization direction of the second pinned magnetic sublayer 26a by the RKKY interaction. The magnetization direction of the second pinned magnetic sublayer 28c is oriented antiparallel to the magnetization direction of the first pinned magnetic sublayer 28a by the RKKY interaction, and the magnetization direction of the second pinned magnetic sublayer 32a is oriented antiparallel to the magnetization direction of the first pinned magnetic sublayer 32c by the RKKY interaction.

Under such conditions, an exchange anisotropic magnetic field is produced each between the antiferromagnetic layer 21 and the first pinned magnetic sublayer 22a, between the antiferromagnetic layer 27 and the first pinned magnetic sublayer 26c, between the antiferromagnetic layer 27 and the first pinned magnetic sublayer 28a, and between the antiferromagnetic layer 33 and the first pinned magnetic sublayer 32c. Therefore, after annealing in the magnetic field, the magnetization directions of the first pinned magnetic sublayer 22a and the first pinned magnetic sublayer 26c are pinned antiparallel to the Y direction, and the magnetization directions of the first pinned magnetic sublayer 28a and the first pinned magnetic sublayer 32c are pinned in the Y direction.

The laminate including the antiferromagnetic layer 21 to the antiferromagnetic layer 33 is formed into a trapezoidal shape by masking with a resist and ion milling. Insulating layers 34, bias underlayers 35, hard bias layers 36, insulating layers 37, bias underlayers 38, hard bias layers 39, and insulating layers 40 are then deposited. The hard bias layers 36 are formed so as to face the end faces of the free magnetic layer 24, and the hard bias layers 39 are formed so as to face the end faces of the free magnetic layers 30.

Insulating layers 42 are formed by patterning over the insulating layers 40 and both end regions in the track width direction (in the X direction) of the antiferromagnetic layer 33 with a predetermined distance T therebetween.

A second electrode layer 41 is then formed over the insulating layers 42 and the antiferromagnetic layer 33, and an upper shielding layer (not shown in the drawing) composed of a soft magnetic material, such as NiFe, is formed in contact with the upper surface of the electrode layer 41. Since the soft magnetic material, such as NiFe, is electrically conductive, the upper shielding layer may be formed directly on the upper surface of the antiferromagnetic layer 33 so as to act as an electrode layer.

As a result, as shown in FIG. 5, a magnetic sensing element R3 is obtained, in which the magnetization directions of the second pinned magnetic sublayer 22c of the pinned magnetic layer 22 and the second pinned magnetic sublayer 26a of the pinned magnetic layer 26 are oriented in the Y direction, and the magnetization directions of the second pinned magnetic sublayer 28c of the pinned magnetic layer 28 and the second pinned magnetic sublayer 32a of the pinned magnetic layer 32 are pinned antiparallel to the Y direction.

The magnetization directions of the free magnetic layers 24 and 30 are aligned substantially perpendicular to the magnetization directions of the pinned magnetic layers 22, 26, 28, and 32 by magnetic coupling with the hard bias layers 36 and 39. Preferably, the relative angle between the magnetization direction of the second pinned magnetic sublayer which directly contributes to the change in electrical resistance (output) and the magnetization direction of the free magnetic layer is orthogonal when a sensing current is applied and a signal magnetic field is not applied.

By adjusting the magnetization directions of the free magnetic layers 24 and 30 and the pinned magnetic layers 22, 26, 28, and 32 as described above, the magnetic sensing element R3 can output a pulsed signal directly when moving over the magnetization transition region of a recording medium.

Therefore, unlike the conventional case, signal processing can be performed without passing the output from the magnetic sensing element through a differentiation circuit, and superposition of noise can be suppressed, resulting in an increase in the S/N ratio of the magnetic sensing element R3.

Moreover, in the magnetic sensing element R3, since the dual spin-valve upper multilayer film U and the dual spin-valve lower multilayer film L are stacked, an output that is more than two times larger than the output of a magnetic sensing element including only one dual spin-valve multilayer film can be obtained. In particular, in the example which will be described below, a magnetic sensing element which has an output that is five times larger than the output of a magnetic sensing element including only one dual spin-valve multilayer film is shown.

Since the layers from the antiferromagnetic layer 21 to the antiferromagnetic layer 33 can be continuously formed in a vacuum, it is possible to prevent impurities in air from entering the magnetic sensing element.

In the present invention, an inductive head for writing may be deposited on the magnetic sensing element. In such a case, the shielding layer (upper shielding layer) formed on the upper side of the magnetic sensing element may be also used as a lower core layer of the inductive head.

In the present invention, the multilayer film may be constructed so as to produce a so-called tunneling magnetoresistive element. In the tunneling magnetoresistive element, nonmagnetic layers are composed of an insulating material, such as $Al_2O_3$ or $SiO_2$.

The magnetic sensing element of the present invention may also be used for a magnetic head for tape recording, a magnetic sensor, etc., in addition to use for a thin-film magnetic head built in a hard disk drive.

While the present invention has been described with reference to the preferred embodiments, it is to be understood that various modifications can be made within the spirit and scope of the present invention.

EXAMPLE

With respect to a magnetic sensing element R shown in FIG. 1, a dual spin-valve CPP magnetic sensing element, and a single spin-valve CPP magnetic sensing element, a relationship between the cross sectional area A in the direction parallel to the plane and the change in magnetoresistance $\Delta R$ was researched.

The layer structure of the magnetic sensing element R was as follows: lower electrode/$(Ni_{0.8}Fe_{0.2})_{60}Cr_{40}$ (55 Å)/$Pt_{50}Mn_{50}$ (170 Å)/$Co_{90}Fe_{10}$ (35 Å)/Ru (9 Å)/$Co_{90}Fe_{10}$ (40 Å)/Cu (30 Å)/$Co_{90}Fe_{10}$ (80 Å)/Cu (30 Å)/$Co_{90}Fe_{10}$ (40 Å)/Ru (9 Å)/$Co_{90}Fe_{10}$ (35 Å)/$Pt_{50}Mn_{50}$ (170 Å)/$Co_{90}Fe_{10}$ (35 Å)/Ru (9 Å)/$Co_{90}Fe_{10}$ (40 Å)/Cu (30 Å)/$Co_{90}Fe_{10}$ (80 Å)/Cu (30 Å)/$Co_{90}Fe_{10}$ (40 Å)/Ru (9 Å)/$Co_{90}Fe_{10}$ (35 Å)/$Pt_{50}Mn_{50}$ (170 Å)/upper electrode.

The layer structure of the dual spin-valve CPP magnetic sensing element was as follows: lower electrode/$(Ni_{0.8}Fe_{0.2})_{60}Cr_{40}$ (55 Å)/$Pt_{50}Mn_{50}$ (170 Å)/$Co_{90}Fe_{10}$ (35 Å)/Ru (9 Å)/$Co_{90}Fe_{10}$ (40 Å)/Cu (30 Å)/$Co_{90}Fe_{10}$ (80 Å)/Cu (30 Å)/$Co_{90}Fe_{10}$ (40 Å)/Ru (9 Å)/$Co_{90}Fe_{10}$ (35 Å)/$Pt_{50}Mn_{50}$ (170 Å)/upper electrode.

The layer structure of the single spin-valve CPP magnetic sensing element was as follows: lower electrode/$(Ni_{0.8}Fe_{0.2})_{60}Cr_{40}$ (55 Å)/$Pt_{50}Mn_{50}$ (170 Å)/$Co_{90}Fe_{10}$ (35 Å)/Ru (9 Å)/$Co_{90}Fe_{10}$ (40 Å)/Cu (30 Å)/$Co_{90}Fe_{10}$ (80 Å)/upper electrode.

With respect to these magnetic sensing elements, while the cross sectional area A in the direction parallel to the plane (X-Y plane direction) was changed, a sensing current with constant current density was applied in a direction perpendicular to the plane, and the change in magnetoresistance $\Delta R$ was measured. The results thereof are shown in FIG. 12.

In this example, the change in magnetoresistance $\Delta R$ is plotted when the magnetization of the free magnetic layer is saturated by applying a constant magnetic field from outside to the CPP magnetic sensing element. With respect to the magnetic sensing element R, the magnetizations of the second pinned magnetic sublayers 28c and 32a of the upper multilayer film U and the second pinned magnetic sublayers 22c and 26a of the lower multilayer film L are oriented in the same direction so that the magnetoresistance changed when the magnetizations of the free magnetic layers 24 and 30 are oriented in the same direction.

Figure 12:
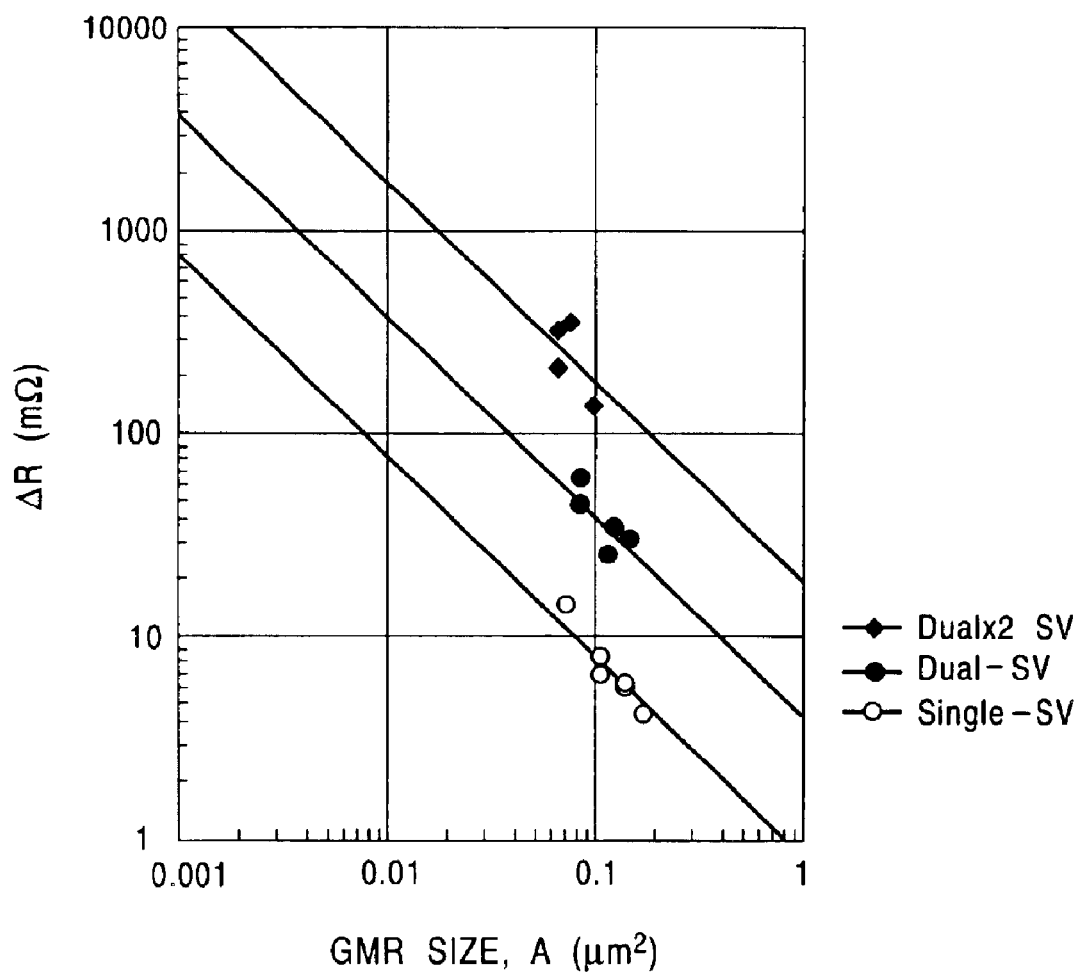
FIG. 12 is a graph which shows a relationship between the magnetic sensing element size and the change in magnetoresistance.
Figure 13:
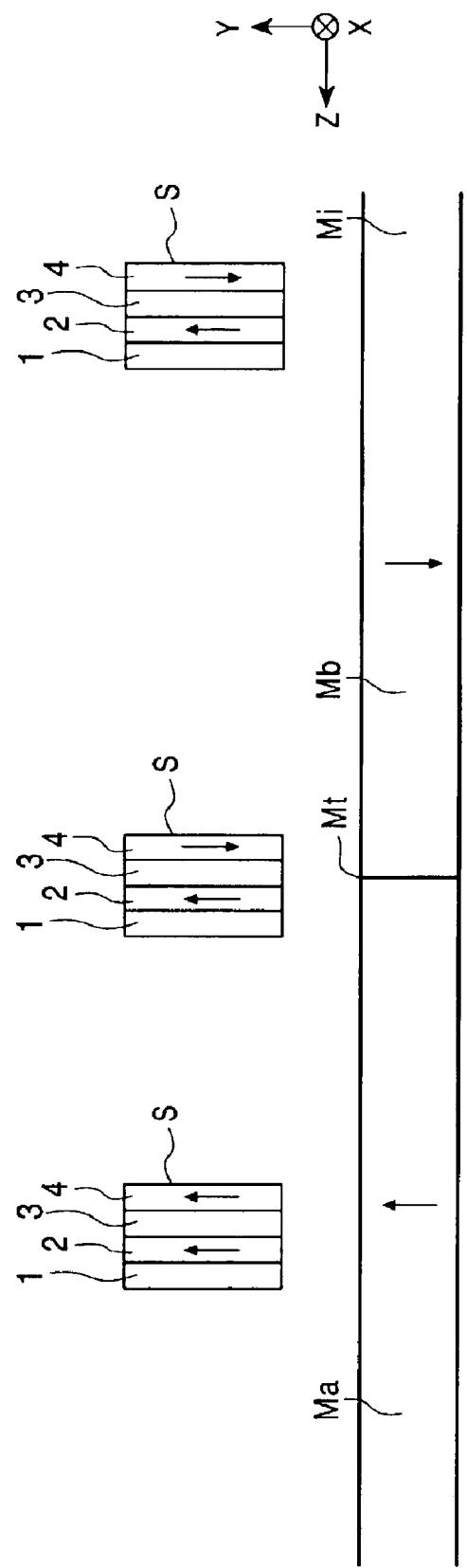
FIG. 13 is a schematic diagram showing a state in which a conventional magnetic sensing element is reading signals recorded in a perpendicular magnetic recording medium.
Figure 14:
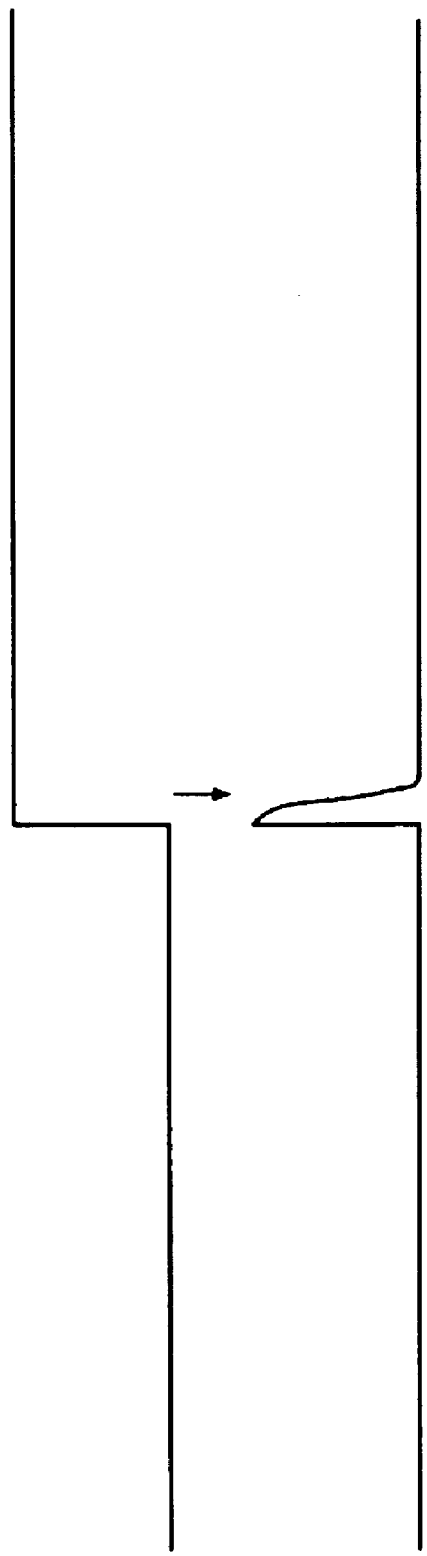
FIG. 14 is a diagram showing output signal waveforms of the magnetic sensing element shown in FIG. 13 when the recorded magnetic fields in the region Ma to the region Mb are detected.

As is obvious from the graph shown in FIG. 12, at the same cross sectional area A, the change in magnetoresistance $\Delta R$ of the magnetic sensing element R is five times that of the dual spin-valve CPP magnetic sensing element, and 25 times that of the single spin-valve CPP magnetic sensing element.

Since a sensing current with the same density is applied to each magnetic sensing element, the change in voltage of the magnetic sensing element R is five times larger than the change in voltage of the dual spin-valve CPP magnetic sensing element, and 25 times larger than the change in voltage of the single spin-valve CPP magnetic sensing element.

It is to be understood that the present invention is not limited to the example described above.

What is claimed is:

1. A magnetic sensing element comprising:
   a lower multilayer film and an upper multilayer film; each multilayer film comprising: a lower pinned magnetic layer, a lower nonmagnetic layer directly deposited on the lower pinned magnetic layer, a free magnetic layer directly deposited on the lower nonmagnetic magnetic layer, an upper nonmagnetic layer, and an upper pinned magnetic layer deposited in that order from the bottom,
   a lower antiferromagnetic layer disposed on a bottom of the lower multilayer film;
   an intermediate antiferromagnetic layer disposed between the lower multilayer film and the upper multilayer film; and
   an upper antiferromagnetic layer disposed on a top of the upper multilayer film,
   wherein a magnetization of each pinned magnetic layer is pinned in a predetermined direction by an exchange coupling magnetic field produced between the pinned magnetic layer and the adjacent antiferromagnetic layer;
   wherein a current flows perpendicular to a plane of each layer; and
   wherein the magnetization directions of the upper and lower pinned magnetic layers in the lower multilayer film are antiparallel to the magnetization directions of the upper and lower pinned magnetic layers in the upper multilayer film.

2. A magnetic sensing element according to claim 1, wherein all of the four pinned magnetic layers have the same thickness.

3. A magnetic sensing element according to claim 1, wherein the two free magnetic layers have the same thickness, and all of the four nonmagnetic layers have the same thickness.

4. A magnetic sensing element according to claim 1, further comprising a hard magnetic layer disposed on the intermediate antiferromagnetic layer, and another intermediate antiferromagnetic layer disposed on the hard magnetic layer.

5. A magnetic sensing element according to claim 1, wherein all of the antiferromagnetic layers have the same thickness.

6. A magnetic sensing element according to claim 1, wherein all of the antiferromagnetic layers comprise the same antiferromagnetic material.

7. A magnetic sensing element according to claim 1, wherein each antiferromagnetic layer comprises a PtMn alloy; an X—Mn alloy, where X is at least one element selected from the group consisting of Pd, Ir, Rh, Ru, Os, Ni, and Fe; or a Pt—Mn—X' alloy, where X' is at least one element selected from the group consisting of Pd, Ir, Rh, Ru, Au, Ag, Os, Cr, Ni, Ar, Ne, Xe, and Kr.

8. A magnetic sensing device comprising a magnetic sensing element according to claim 1, wherein the magnetic sensing element detects signal magnetic fields recorded in a planar recording medium which is magnetized perpendicular to a plane of the planar recording medium.

9. A magnetic sensing device comprising a magnetic sensing element according to claim 1, wherein only one free magnetic layer is disposed between the lower pinned magnetic layer and the upper pinned magnetic layer in each multilayer film.

10. A magnetic sensing element comprising:
    a lower multilayer film and an upper multilayer film, each multilayer film comprising:
       a lower pinned magnetic layer, a lower nonmagnetic layer, a free magnetic layer, an upper nonmagnetic layer, and an upper pinned magnetic layer deposited in that order from the bottom, the upper and lower pinned magnetic layer of the upper and lower multilayer films each comprising a first pinned magnetic sublayer, a second pinned magnetic sublayer, and an intermediate nonmagnetic sublayer interposed between the first pinned magnetic sublayer and the second pinned magnetic sublayer;
    a lower antiferromagnetic layer disposed on a bottom of the lower multilayer film;
    an intermediate antiferromagnetic layer disposed between the lower multilayer film and the upper multilayer film; and
    an upper antiferromagnetic layer disposed on a top of the upper multilayer film,
    wherein a magnetization of each pinned magnetic layer is pinned in a predetermined direction by an exchange coupling magnetic field produced between the pinned magnetic layer and the adjacent antiferromagnetic layer;
    wherein in each pinned magnetic layer, the first pinned magnetic sublayer is in contact with one of the antiferromagnetic layers and the second pinned magnetic sublayer faces the free magnetic layer with the nonmagnetic layer therebetween;
    wherein a current flows perpendicular to a plane of each layer; and
    wherein at least one of:
       the magnetization directions of the first and second pinned magnetic sublayers in the lower pinned magnetic layer in the lower multilayer film are antiparallel to the magnetization directions of the first and second pinned magnetic sublayers respective in tile lower pinned magnetic layer in the upper multilayer film, or
       the magnetization directions of the first and second pinned magnetic sublayers in the upper pinned magnetic layer in the lower multilayer film are antiparallel to the magnetization directions of the first and second pinned magnetic sublayers respective in the upper pinned magnetic layer in the upper multilayer film.

11. A magnetic sensing element according to claim 10, wherein all of the four pinned magnetic layers have the same thickness.

12. A magnetic sensing element according to claim 10, wherein the first and second pinned magnetic sublayers have different magnetic moments per unit area.

13. A magnetic sensing element according to claim 12, wherein the first pinned magnetic sublayer and the second pinned magnetic sublayer comprise the same magnetic material and have different thicknesses.

14. A magnetic sensing element according to claim 12, wherein the first pinned magnetic sublayers of the four pinned magnetic layers have the same first thickness, and the second pinned magnetic sublayers of the four pinned magnetic layers have the same second thickness.

15. A magnetic sensing element according to claim 10, wherein the two free magnetic layers have the same thickness, and all of the four nonmagnetic layers have the same thickness.

16. A magnetic sensing element according to claim 10, further comprising a hard magnetic layer disposed on the intermediate antiferromagnetic layer, and another intermediate antiferromagnetic layer disposed on the hard magnetic layer.

17. A magnetic sensing element according to claim 10, wherein all of the antiferromagnetic layers have the same thickness.

18. A magnetic sensing element according to claim 10, wherein all of the antiferromagnetic layers comprise the same antiferromagnetic material.

19. A magnetic sensing element according to claim 10, wherein each antiferromagnetic layer comprises a PtMn alloy; an X—Mn alloy, where X is at least one element selected from the group consisting of Pd, Ir, Rh, Ru, Os, Ni, and Fe; or a Pt—Mn—X' alloy, where X' is at least one element selected from the group consisting of Pd, Ir, Rh, Ru, Au, Ag, Os, Cr, Ni, Ar, Ne, Xe, and Kr.

20. A magnetic sensing device comprising a magnetic sensing element according to claim wherein the magnetic sensing element detects signal magnetic fields recorded in a planar recording medium which is magnetized perpendicular to a plane of the planar recording medium.

21. A magnetic sensing device comprising a magnetic sensing element according to claim 10, wherein only one free magnetic layer is disposed between the lower pinned magnetic layer and the upper pinned magnetic layer in each multilayer film.

* * * * *

UNITED STATES PATENT AND TRADEMARK OFFICE
CERTIFICATE OF CORRECTION

PATENT NO. : 6,862,159 B2
DATED : March 1, 2005
INVENTOR(S) : Naoya Hasegawa

It is certified that error appears in the above-identified patent and that said Letters Patent is hereby corrected as shown below:

Column 47,
Lines 15-16, delete "Pt—Mn—X" and substitute -- Pt—Mn—X' -- in its place.

Column 48,
Line 6, after "to claim" insert -- 10, --.

Signed and Sealed this

Fifteenth Day of November, 2005

JON W. DUDAS
*Director of the United States Patent and Trademark Office*